(12) United States Patent
Takahashi et al.

(10) Patent No.: US 11,585,860 B2
(45) Date of Patent: Feb. 21, 2023

(54) SEMICONDUCTOR DEVICE

(71) Applicant: Nuvoton Technology Corporation Japan, Kyoto (JP)

(72) Inventors: Kensuke Takahashi, Shiga (JP); Toshifumi Ishida, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/777,204

(22) PCT Filed: May 12, 2021

(86) PCT No.: PCT/JP2021/017983
§ 371 (c)(1),
(2) Date: May 16, 2022

(87) PCT Pub. No.: WO2021/230269
PCT Pub. Date: Nov. 18, 2021

(65) Prior Publication Data
US 2022/0373605 A1 Nov. 24, 2022

Related U.S. Application Data

(60) Provisional application No. 63/024,250, filed on May 13, 2020.

(51) Int. Cl.
*G01R 31/389* (2019.01)
*G01R 31/3842* (2019.01)
(Continued)

(52) U.S. Cl.
CPC ......... *G01R 31/389* (2019.01); *G01R 31/364* (2019.01); *G01R 31/3842* (2019.01); *H01L 27/0629* (2013.01); *H02J 7/007* (2013.01)

(58) Field of Classification Search
CPC ............. G01R 31/389; G01R 31/3842; G01R 31/364; H02J 7/00
See application file for complete search history.

(56) References Cited

U.S. PATENT DOCUMENTS 6,118,253 A * 9/2000 Mukainakano ....... H02J 7/0063
320/136
6,316,990 B1 11/2001 Tanizawa
(Continued)

FOREIGN PATENT DOCUMENTS

JP H09-114530 A 5/1997
JP H10-308635 A 11/1998
(Continued)

OTHER PUBLICATIONS

International Search Report issued in International Patent Application No. PCT/JP2021/017983, dated Jul. 20, 2021 with English translation.
(Continued)

*Primary Examiner* — Richard V Muralidar
(74) *Attorney, Agent, or Firm* — McDermott Will & Emery LLP

(57) ABSTRACT

A semiconductor device that is of a face-down mounted chip-size package type, discharges electric charges stored in an electric storage device (battery), and has a power loss area ratio of at least 0.4 (W/mm$^2$) obtained by dividing a power loss (W) in the semiconductor device at time of the discharge by an area (mm$^2$) of the semiconductor device, the semiconductor device comprising: a field-effect transistor of a horizontal type and a resistor that are connected in series in stated order between an inflow terminal and an outflow terminal; and a control circuit that causes a discharge current to be constant without depending on an applied voltage between the inflow terminal and the outflow terminal. A difference between a maximum temperature of a field-effect
(Continued)

transistor portion and a temperature of a resistor portion is within five degrees Celsius in a discharge period.

19 Claims, 22 Drawing Sheets

(51) Int. Cl.
*H02J 7/00* (2006.01)
*G01R 31/364* (2019.01)
*H01L 27/06* (2006.01)

(56) References Cited

U.S. PATENT DOCUMENTS

| | | | | |
|---|---|---|---|---|
| 7,511,458 B2* | 3/2009 | Mori | ......................... | H02J 7/00 320/145 |
| 8,415,926 B2 | 4/2013 | Bhardwaj et al. | | |
| 9,411,346 B2* | 8/2016 | Karino | .................... | G05F 1/462 |
| 11,049,856 B2* | 6/2021 | Yoshida | .................... | H01C 1/08 |
| 2005/0212588 A1 | 9/2005 | Tanizawa | | |
| 2017/0040824 A1 | 2/2017 | Yasuda et al. | | |
| 2020/0388609 A1 | 12/2020 | Yoshida et al. | | |

FOREIGN PATENT DOCUMENTS

| | | |
|---|---|---|
| JP | 2005-275701 A | 10/2005 |
| JP | 4240691 B2 | 1/2009 |
| JP | 2011-010417 A | 1/2011 |
| JP | 2013-221790 A | 10/2013 |
| JP | 2018-151344 A | 9/2018 |
| JP | 6573189 B1 | 8/2019 |
| WO | 2015/166654 A1 | 11/2015 |

OTHER PUBLICATIONS

Written Opinion issued in International Patent Application No. PCT/JP2021/017983, dated Jul. 20, 2021; with English translation.

* cited by examiner

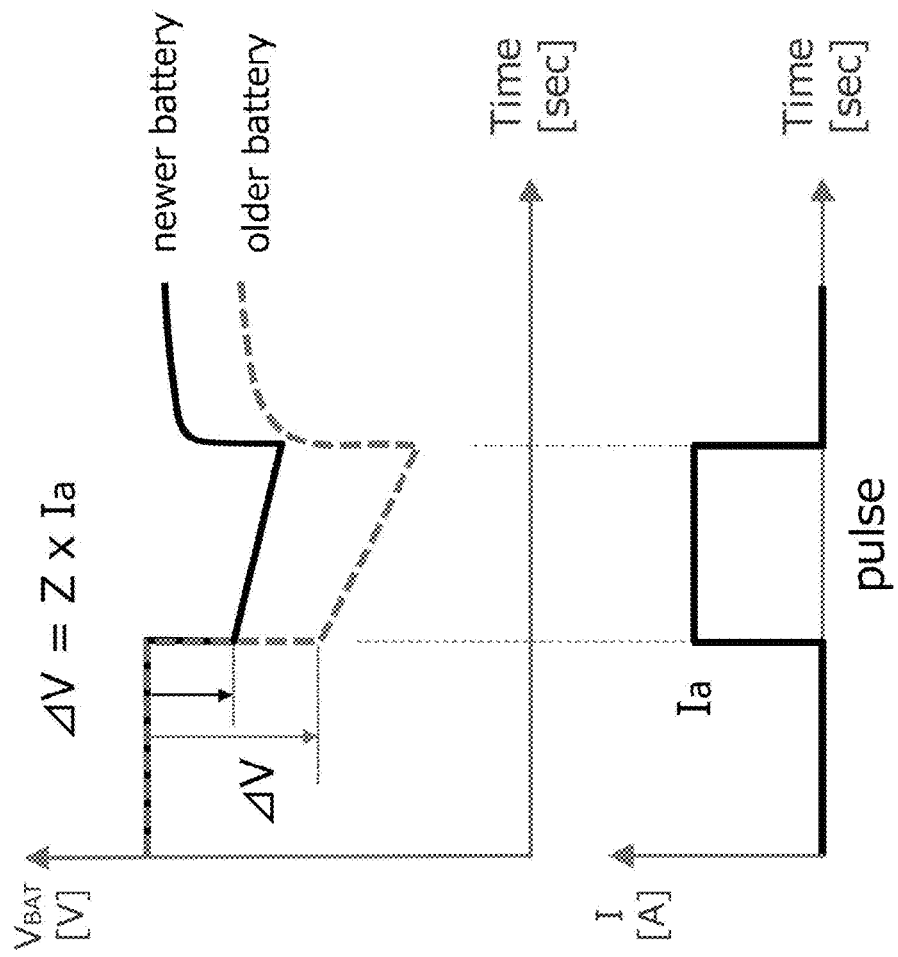

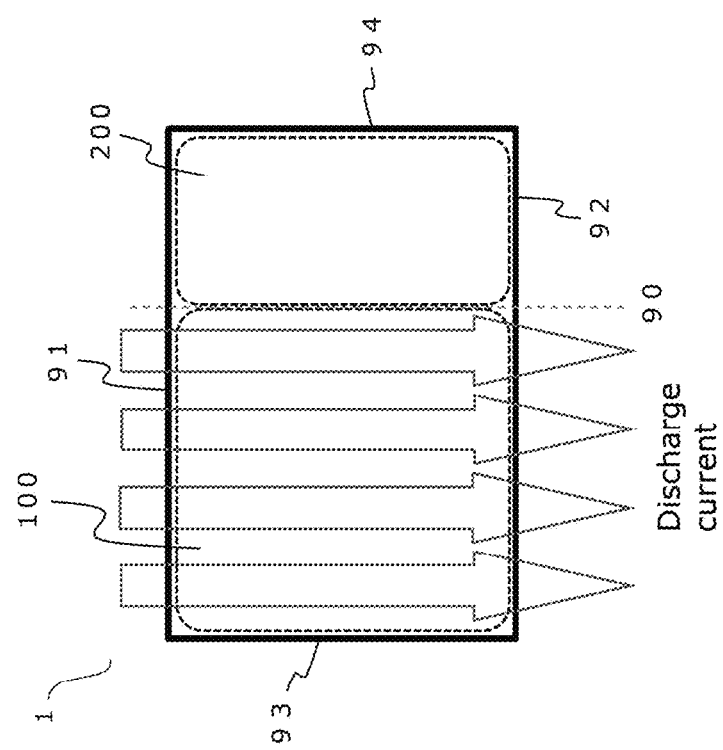

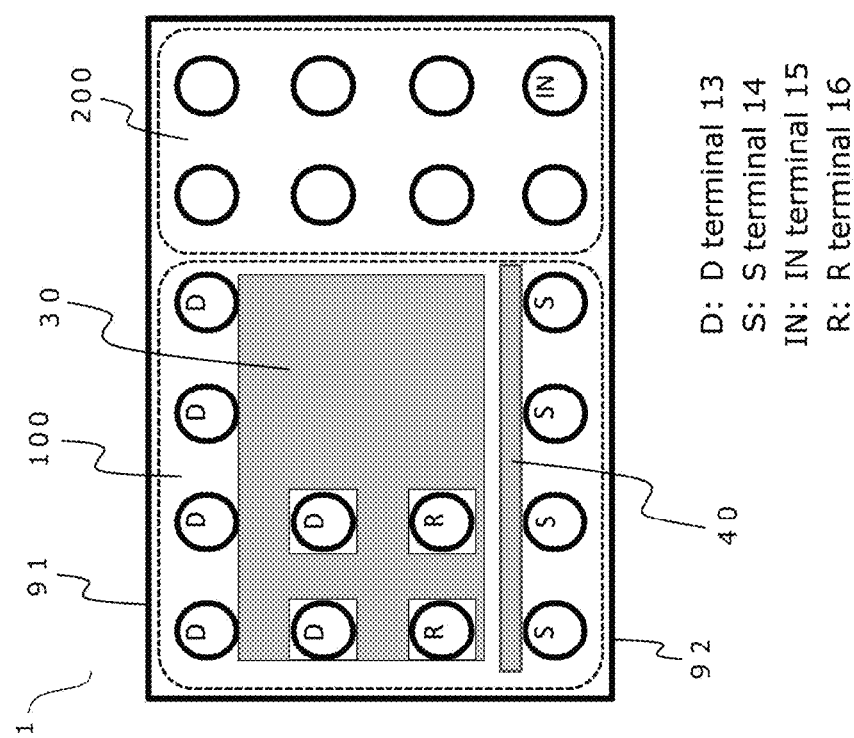

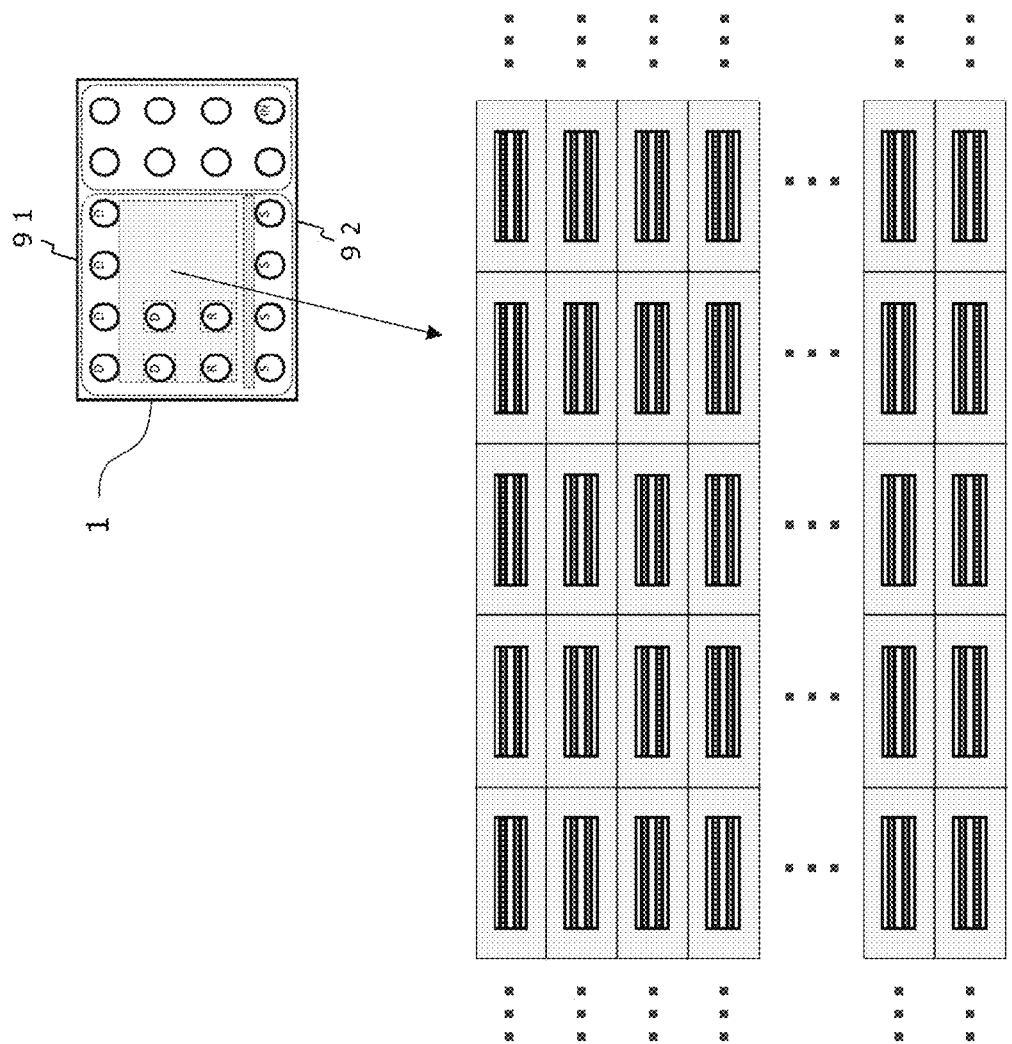

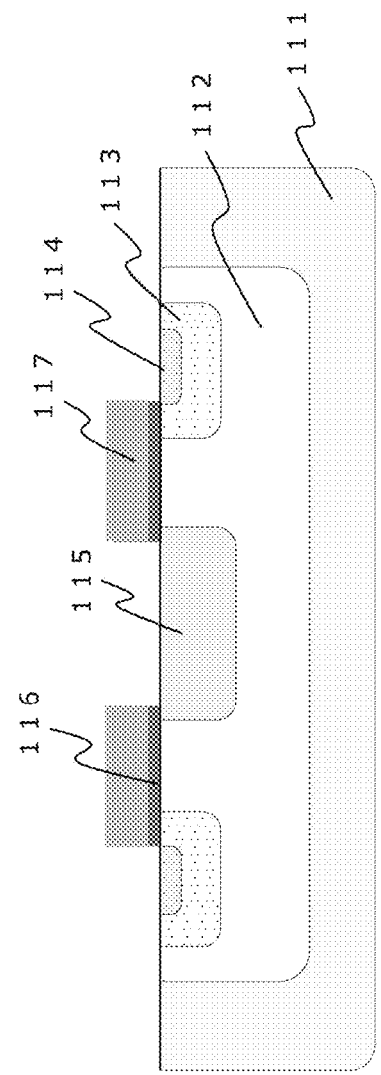

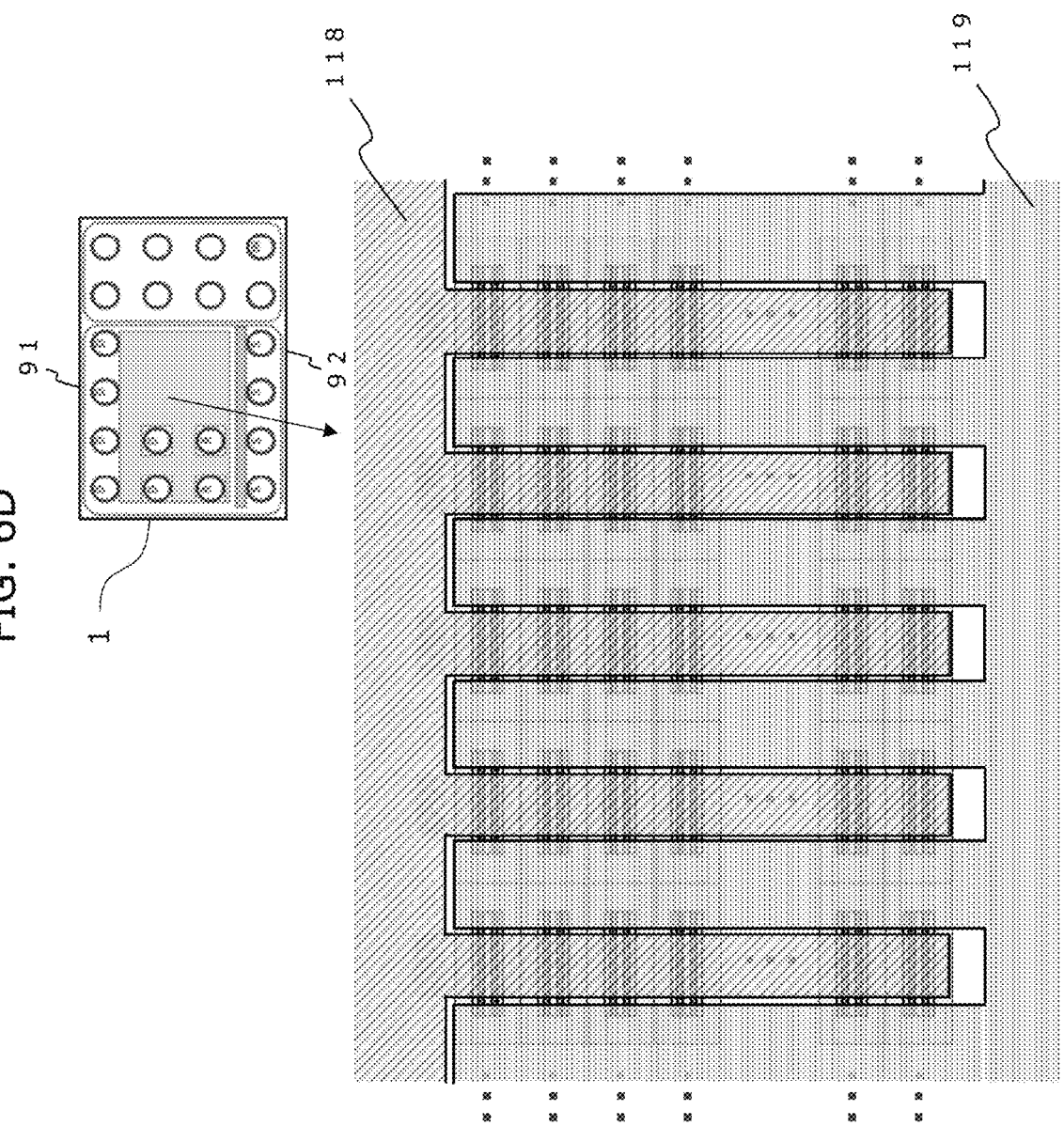

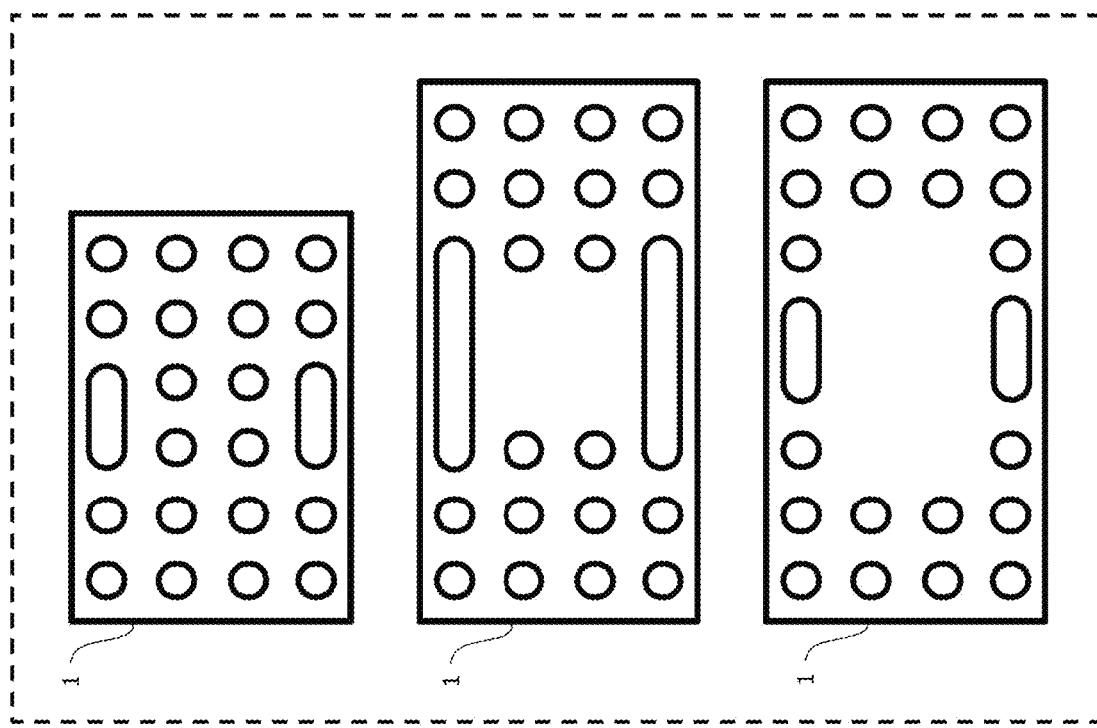

SEMICONDUCTOR DEVICE

CROSS-REFERENCE OF RELATED APPLICATIONS

This application is the U.S. National Phase under 35 U.S.C. § 371 of International Patent Application No. PCT/JP2021/017983, filed on May 12, 2021, which is based on and claims priority of U.S. Provisional Patent Application No. 63/024,250, filed on May 13, 2020, the entire disclosures of which Applications are incorporated by reference herein.

TECHNICAL FIELD

The present disclosure relates to a semiconductor device, and particularly to a power loss dispersive switching device with a built-in resistor.

BACKGROUND ART

There has been a demand for a semiconductor device capable of highly accurately measuring an internal impedance of a secondary battery such as a lithium-ion battery.

CITATION LIST

Patent Literature

[PTL 1] U.S. Pat. No. 8,415,926
[PTL 2] Japanese Patent No. 6573189

SUMMARY OF INVENTION

Technical Problem

A secondary battery such as a lithium-ion battery cannot avoid deteriorating when charge and discharge is repeated. The deterioration of a battery is synonymous with an increase in internal impedance of the battery, and the increase in internal impedance leads to a decrease in safety of the battery. For this reason, there has been a demand for a technique for highly accurately measuring an internal impedance of a battery.

As shown in FIG. 1A, there is, for example, a method of measuring internal impedance Z (Ω) based on a manner of voltage drop ΔV (V) of a battery by causing the battery to discharge for less than one second (see PTL 1). In order to achieve high accuracy by this method, a discharge current is required to always have constant value Ia (A) during a discharge period. However, varying of a current value due to a voltage of the battery and a temperature of a use environment at that time, or the influence of heat generated by the discharge current itself being conducted is an issue. As schematically shown in FIG. 1B, a variation width of a manner of a change in voltage due to the influence of the variation in current value makes it difficult to accurately measure an internal Impedance of the battery.

Solution to Problem

A semiconductor device according to one aspect of the present disclosure that is of a face-down mounted chip-size package type, discharges electric charges stored in an electric storage device, and has a power loss area ratio of at least 0.4 (W/mm$^2$) obtained by dividing a power loss (W) in the semiconductor device at time of the discharge by an area (mm$^2$) of the semiconductor device, the semiconductor device comprising: an inflow terminal and an outflow terminal into and out of which a discharge current flows, respectively, at the time of the discharge; a control terminal that controls a discharge period for the discharge; a field-effect transistor of a lateral type and a resistor that are connected in series in stated order between the inflow terminal and the outflow terminal; and a control circuit connected to the control terminal, the control circuit causing the discharge current to be constant without depending on an applied voltage between the inflow terminal and the outflow terminal. A difference between a maximum temperature of a field-effect transistor portion and a temperature of a resistor portion is within five degrees Celsius in the discharge period, the field-effect transistor portion being a region in which the field-effect transistor is disposed, the resistor portion being a region in which the resistor is disposed.

Alternatively, a semiconductor device according to one aspect of the present disclosure that is of a face-down mounted chip-size package type, discharges electric charges stored in an electric storage device, and has a power loss area ratio of at least 0.4 (W/mm$^2$) obtained by dividing a power loss (W) In the semiconductor device at time of the discharge by an area (mm$^2$) of the semiconductor device, the semiconductor device comprising: a plurality of inflow terminals and a plurality of outflow terminals into and out of which a discharge current flows, respectively, at the time of the discharge; a control terminal that controls a discharge period for the discharge; a field-effect transistor of a lateral type and a resistor that are connected in series in stated order between the plurality of inflow terminals and the plurality of outflow terminals; and a control circuit connected to the control terminal, the control circuit causing the discharge current to be constant without depending on an applied voltage between the plurality of inflow terminals and the plurality of outflow terminals. The semiconductor device is rectangular in shape in a plan view of the semiconductor device. A part or all of the plurality of Inflow terminals are arranged along one longer side of the semiconductor device. A part or all of the plurality of outflow terminals are arranged along an other longer side of the semiconductor device. The semiconductor device includes a conduction region that includes the field-effect transistor and the resistor and through which the discharge current flows, and a control region that includes the control circuit and through which the discharge current does not flow. The conduction region and the control region are divided by a virtual boundary line parallel to one shorter side of the semiconductor device. The control region has an area at least one-sixth and less than one-half the area of the semiconductor device.

Advantageous Effects of Invention

A semiconductor device according to one aspect of the present disclosure is capable of causing a discharge current from an electric storage device, such as a battery, connected to the semiconductor device to have a desired predetermined constant value without depending on a voltage of the electric storage device, and causing the discharge current to flow. Additionally, since the semiconductor device is capable of suppressing the occurrence of a local rise in temperature in a plane of the semiconductor device during a discharge period in which the discharge current having the constant value flows, the semiconductor device is capable of highly accurately measuring an internal impedance of the electric storage device.

BRIEF DESCRIPTION OF DRAWINGS

FIG. 1A is an electrical characteristics graph Illustrating a method of measuring an internal impedance of a battery.

FIG. 5A is a plan view illustrating an example of a structure of the semiconductor device according to Embodiment 1.

FIG. 5B is a plan view illustrating an example of a structure of the semiconductor device according to Embodiment 1.

FIG. 6A is a plan view illustrating an example of a structure of the field-effect transistor included in the semiconductor device according to Embodiment 1.

FIG. 6C is a cross-sectional view illustrating the example of the structure of the unit cells of the field-effect transistor included in the semiconductor device according to Embodiment 1.

FIG. 6D is a plan view illustrating an example of an electrode structure of the field-effect transistor included in the semiconductor device according to Embodiment 1.

FIG. 7B is a plan view illustrating examples of a structure of the semiconductor device according to Embodiment 1.

Figure 1B:
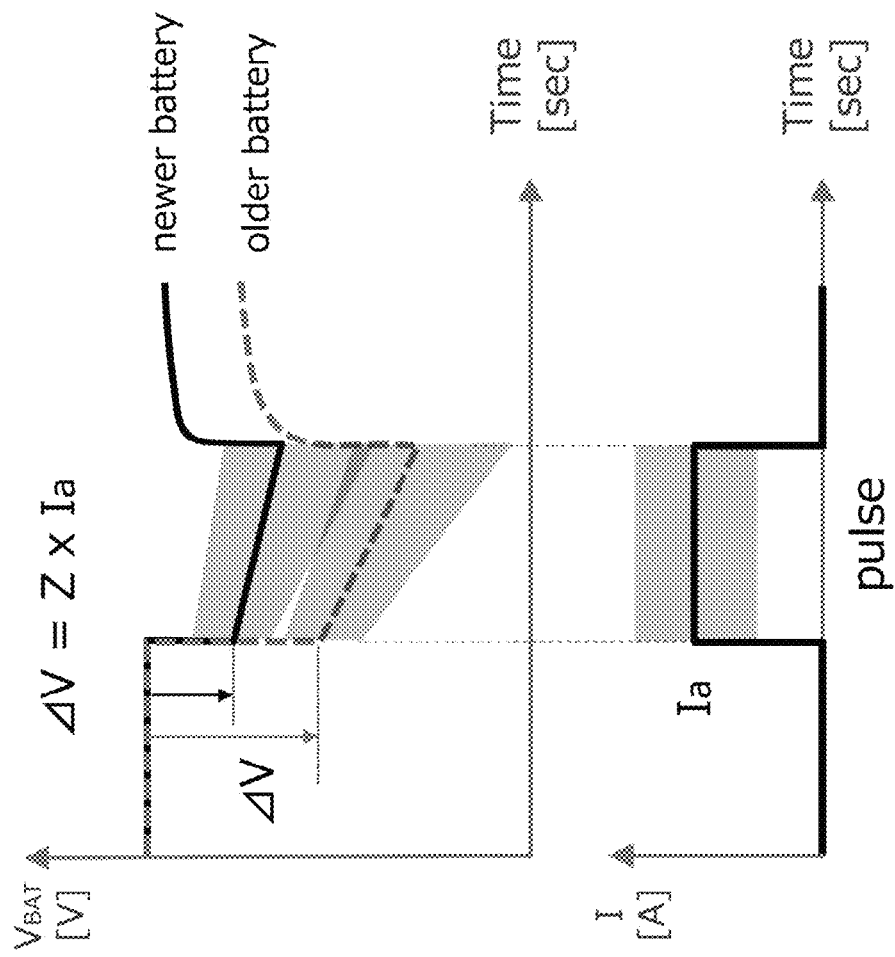
FIG. 1B is an electrical characteristics graph schematically illustrating the influence of a variation in discharge current in the method of measuring the Internal Impedance of the battery.

DESCRIPTION OF EMBODIMENTS (Circumstances that Led to One Aspect of the Present Disclosure)

In order to accurately measure an internal impedance of an electric storage device, such as a battery, using the method illustrated in FIG. 1A, it is important to suppress a variation in current value of a discharge current from the electric storage device. PTL 2 discloses a semiconductor device Integrally including a field-effect transistor that has a switching function to control discharge of an electric storage device, and a resistor that controls a discharge current. However, a problem with PTL 2 is that the resistor locally generates a large amount of heat due to the conduction of current, a resistance value of the resistor changes due to temperature characteristics, and a variation in current value of the discharge current cannot be reduced to a certain level or lower in principle.

In view of this, the inventors have developed a power loss dispersive switching device with a built-in resistor that intentionally increases a power loss in a field-effect transistor having a switching function, and disperses the power loss so that the field-effect transistor and a resistor have approximately the same maximum temperature due to heat generated at the time of current conduction. It should be noted that a power loss is synonymous with a power consumption. Such a device contains a control circuit that functions so that a discharge current always having a constant value flows during a discharge period of an electric storage device, by the resistor sensing the discharge current and feeding back a generated voltage to the field-effect transistor. The term always means that a discharge current does not depend on a voltage of an electric storage device or a temperature of a use environment in a discharge period.

A semiconductor device according to one aspect of the present disclosure may be as follows. The semiconductor device that is of a face-down mounted chip-size package type, discharges electric charges stored in an electric storage device, and has a power loss area ratio of at least 0.4 (W/mm2) obtained by dividing a power loss (W) in the semiconductor device at time of the discharge by an area (mm2) of the semiconductor device, the semiconductor device comprising: an inflow terminal and an outflow terminal into and out of which a discharge current flows, respectively, at the time of the discharge; a control terminal that controls a discharge period for the discharge; a field-effect transistor of a lateral type and a resistor that are connected in series in stated order between the inflow terminal and the outflow terminal; and a control circuit connected to the control terminal, the control circuit causing the discharge current to be constant without depending on an applied voltage between the inflow terminal and the outflow terminal. A difference between a maximum temperature of a field-effect transistor portion and a temperature of a resistor portion is within five degrees Celsius in the discharge period, the field-effect transistor portion being a region in which the field-effect transistor is disposed, the resistor portion being a region in which the resistor is disposed.

Moreover, a semiconductor device according to one aspect of the present disclosure may be as follows. The semiconductor device that is of a face-down mounted-size package type, discharges electric charges stored in an electric storage device, and has a power loss area ratio of at least 0.4 (W/mm$^2$) obtained by dividing a power loss (W) in the semiconductor device at time of the discharge by an area (mm$^2$) of the semiconductor device, the semiconductor device comprising: a plurality of inflow terminals and a plurality of outflow terminals into and out of which a discharge current flows, respectively, at the time of the discharge; a control terminal that controls a discharge period for the discharge; a field-effect transistor of a lateral type and a resistor that are connected in series in stated order between the plurality of inflow terminals and the plurality of outflow terminals; and a control circuit connected to the control terminal, the control circuit causing the discharge current to be constant without depending on an applied voltage between the plurality of inflow terminals and the plurality of outflow terminals. The semiconductor device is rectangular in shape in a plan view of the semiconductor device. A part or all of the plurality of inflow terminals are arranged along one longer side of the semiconductor device. A part or all of the plurality of outflow terminals are arranged along an other longer side of the semiconductor device. The semiconductor device includes a conduction region that includes the field-effect transistor and the resistor and through which the discharge current flows, and a control region that includes the control circuit and through which the discharge current does not flow. The conduction region and the control region are divided by a virtual boundary line parallel to one shorter side of the semiconductor device. The control region has an area at least one-sixth and less than one-half the area of the semiconductor device.

Since each of the semiconductor devices described above is capable of causing a discharge current to always have a desired predetermined constant value without depending on a voltage of a battery, a temperature of a use environment, or other conditions, the semiconductor device is capable of significantly increasing an internal impedance measurement accuracy indicating a deterioration state of the battery. In addition, since heat generated at the time of discharge current conduction is dispersed in a plane of the semiconductor device, it is possible to reduce the influence of temperature characteristics due to a rise in temperature of the resistor. This also enhances an effect of suppressing a variation in current value of the discharge current.

Hereinafter, specific examples of a semiconductor device according to one aspect of the present disclosure will be described with reference to the drawings. The following embodiments each show a specific example of the present disclosure. Therefore, the numerical values, shapes, constituent elements, and arrangements and connection states of constituent elements described in the following embodiments are mere examples, and are not intended to limit the present disclosure. Moreover, each of the figures is a schematic diagram, and is not necessarily an exact illustration. Constituent elements that are substantially the same are given the same reference signs in the figures, and overlapping descriptions will be omitted or simplified.

Additionally, in the present disclosure, the expression "A and B are electrically connected" includes a configuration in which A and B are directly connected via a wiring, a configuration in which A and B are directly connected without a wiring, and a configuration in which A and B are indirectly connected via a resistance component (a resistor, a resistance wiring).

Embodiment 1

<Circuit Characteristics of Semiconductor Device>

Figure 2A:
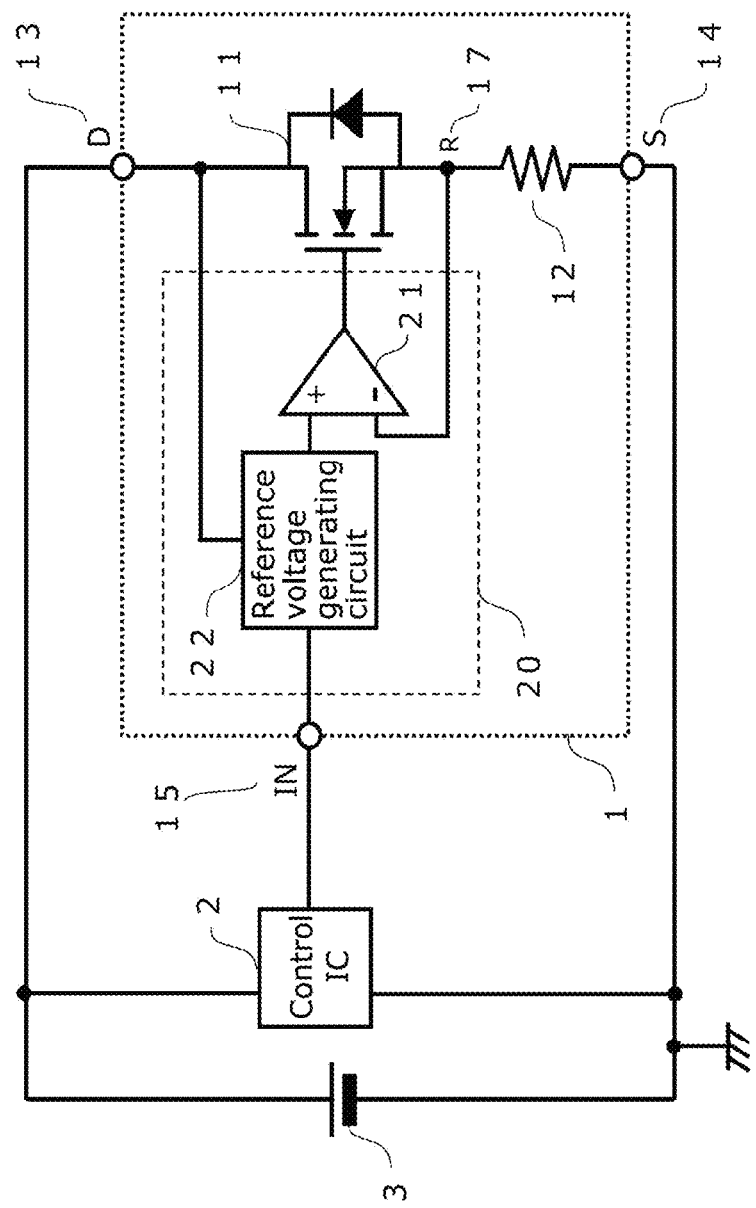
FIG. 2A is a circuit diagram illustrating a semiconductor device according to Embodiment 1.

A configuration and a structure of semiconductor device 1 according to Embodiment 1 will be described below. FIG. 2A and FIG. 5B schematically show a circuit configuration including semiconductor device 1 according to Embodiment 1 and a plan view of semiconductor device 1, respectively.

As shown in FIG. 2A, a secondary battery (battery 3) as represented by a lithium-ion battery is used as an electric storage device in Embodiment 1. Semiconductor device 1 and control IC 2 are both connected to battery 3.

Semiconductor device 1 includes field-effect transistor 11 and resistor 12. Field-effect transistor 11 and resistor 12 are connected in series via first contact point 17 (indicated by R in FIG. 2A). Field-effect transistor 11 has a switching function of causing a predetermined discharge current to flow or stop flowing through semiconductor device 1. Field-effect transistor 11 includes a drain electrode, a source electrode, and a gate electrode that controls a conduction state between the drain electrode and the source electrode. The drain electrode of field-effect transistor 11 is connected to D terminal 13 that is an external connection terminal. D terminal 13 is exposed to a surface of semiconductor device 1 and is an inflow terminal into which a discharge current flows in semiconductor device 1. The source electrode of field-effect transistor 11 is connected to one end of resistor 12 via first contact point 17. Resistor 12 has the one end connected to first contact point 17 and another end connected to S terminal 14 that is an external connection terminal. S terminal 14 is exposed to the surface of semiconductor device 1 and is an outflow terminal out of which a discharge current flows in semiconductor device 1.

Semiconductor device 1 includes IN terminal 15 that is an external connection terminal exposed to the surface. A pulse signal for controlling ON and OFF (opening and closing of the gate) of field-effect transistor 11 is externally inputted to IN terminal 15. When a pulse signal is inputted from the outside (here control IC 2), the gate of field-effect transistor 11 opens, and a predetermined discharge current flows through semiconductor device 1. When the pulse signal is not inputted to IN terminal 15, the gate of field-effect transistor 11 closes, and the predetermined current flowing through semiconductor device 1 stops flowing. In other words, IN terminal 15 is a control terminal for controlling a discharge period by causing a discharge current to flow or stop flowing through semiconductor device 1. Control IC 2 is connected to the cathode of battery 3, and outputs a signal to IN terminal 15, based on a voltage of battery 3. An input signal from control IC 2 is a pulse signal, that is, a square wave voltage for a certain period, and, as described above, the predetermined discharge current flows through field-effect transistor 11 in semiconductor device 1 only during a period in which the signal is inputted.

In Embodiment 1, for purpose of measuring an internal impedance of battery 3, semiconductor device 1 is used for discharge from battery 3. The discharge from battery 3 proceeds by control IC 2 receiving a signal from the outside not shown in FIG. 2A and outputting a pulse signal to IN terminal 15 of semiconductor device 1 and by the gate of field-effect transistor 11 opening. Although a voltage of battery 3 drops at the start of the discharge, the dropped voltage starts to recover concurrently with the end of the discharge. Since a manner of the voltage drop and recovery changes due to the influence of the internal impedance of battery 3, measuring a manner of the voltage change over time makes it possible to determine the internal impedance of battery 3, that is, a degree of deterioration of battery 3.

As shown in FIG. 1A and FIG. 1B, at this time, it is desirable that the discharge current caused to flow by the discharge be constant regardless of various factors such as a voltage (an applied voltage between D terminal 13 and S terminal 14) of battery 3 or a temperature of a use environment. In the present embodiment, for purpose of keeping constant a discharge current flowing through semiconductor device 1, semiconductor device 1 contains control circuit 20 that includes at least operational amplifier 21 and reference voltage generating circuit 22.

Figure 2B:
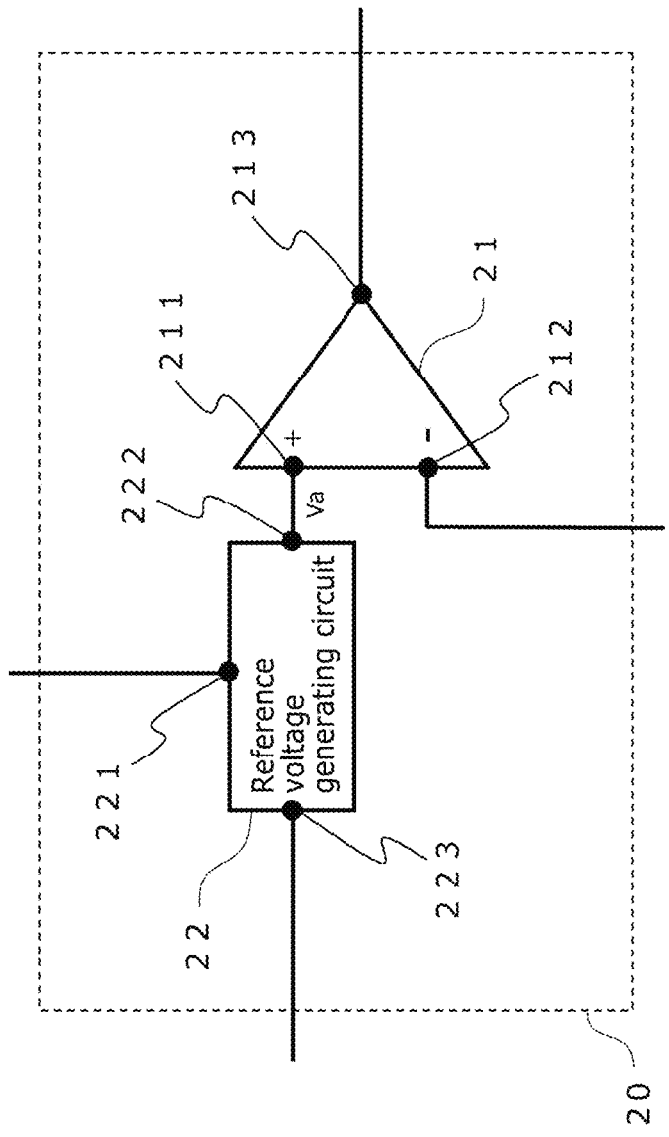
FIG. 2B is a circuit diagram illustrating a portion of the semiconductor device according to Embodiment 1.

FIG. 2B is a schematic diagram illustrating the details of control circuit 20 shown in FIG. 2A. Operational amplifier 21 includes non-inverting input terminal 211, inverting input terminal 212, and output terminal 213. Reference voltage generating circuit 22 includes: input terminal 221 to which a voltage is inputted from the outside; output terminal 222 from which a constant voltage is always outputted even when a voltage (an applied voltage between D terminal 13 and S terminal 14) inputted to input terminal 221 changes; and pulse signal input terminal 223 to which a pulse signal for controlling ON and OFF (opening and closing of the gate) of field-effect transistor 11 is inputted from the outside. It should be noted that a voltage necessary for reference voltage generating circuit 22 to generate a reference voltage is inputted to input terminal 221 of reference voltage generating circuit 22. In other words, control circuit 20 is supplied with power from the inflow terminal (D terminal 13).

In Embodiment 1, first, control IC 2 receives a signal from the outside not shown to cause battery 3 to discharge, and transmits a pulse signal to IN terminal 15 of semiconductor device 1. In semiconductor device 1, IN terminal 15 is connected to pulse signal input terminal 223 of reference voltage generating circuit 22. When reference voltage generating circuit 22 receives the pulse signal through pulse signal input terminal 223, reference voltage generating circuit 22 functions to always output a predetermined voltage (here Va (V)) from output terminal 222. In FIG. 2A, since input terminal 221 is connected to the anode of battery 3 via D terminal 13, reference voltage generating circuit 22 generates a reference voltage based on this connection. Although a voltage inputted to input terminal 221 of reference voltage generating circuit 22 changes due to a voltage of battery 3 etc., voltage Va outputted from output terminal 222 never changes. Output terminal 222 of reference voltage generating circuit 22 is connected to non-inverting input terminal 211 of operational amplifier 21, and predetermined voltage Va is transferred to operational amplifier 21.

It should be noted that input terminal 221 through which the power is inputted to reference voltage generating circuit 22 need not be connected to D terminal 13 as shown in FIG. 2A. Since a voltage necessary to output a reference voltage needs to be inputted to input terminal 221, input terminal 221 may be electrically connected to another external connection terminal to which a voltage equivalent to a voltage applied to D terminal 13, the inflow terminal, is applied. Here, the expression "be electrically connected" also means being connected via any functional circuit.

Output terminal 213 of operational amplifier 21 is connected to the gate electrode of field-effect transistor 11. Accordingly, the pulse signal from control IC 2 is transmitted to field-effect transistor 11 via reference voltage generating circuit 22 and operational amplifier 21 in stated order in semiconductor device 1, and causes the gate of field-effect transistor 11 to open and close. On the other hand, inverting input terminal 212 of operational amplifier 21 is connected to first contact point 17, and operational amplifier 21 has a function of adjusting a voltage to be outputted from output terminal 213, depending on a relationship between voltage Va transferred to non-inverting input terminal 211 and a voltage (here represented as Vr (V)) at first contact point 17 transferred to inverting input terminal 212. When the voltage transferred to non-inverting input terminal 211 is higher (Va>Vr), operational amplifier 21 adjusts the voltage to be outputted from output terminal 213 to be higher, and operates to further open the gate of field-effect transistor 11 to increase the current quantity. When the voltage transferred to non-inverting input terminal 211 is lower (Va<Vr), operational amplifier 21 adjusts the voltage to be outputted from output terminal 213 to be lower, and operates to close the gate of field-effect transistor 11 to decrease the current quantity.

To put it another way, operational amplifier 21 has a function of (i) sensing a current value of the discharge current always flowing through semiconductor device 1, by inverting input terminal 212 receiving the voltage (Vr) at first contact point 17, and (ii) automatically adjusting the opening and closing of the gate of field-effect transistor 11, based on the current value. Since an increase in current value of the discharge current of semiconductor device 1 leads to an increase in voltage (Vr) at first contact point 17, voltage Va received by non-inverting input terminal 211 of operational amplifier 21 becomes lower than voltage Vr received by inverting input terminal 212. In such a situation, operational amplifier 21 adjusts the voltage to be outputted from output terminal 213 to be lower to decrease the quantity of the discharge current of semiconductor device 1. In that case, Va becomes higher than Vr because the quantity of the discharge current decreases, and operational amplifier 21 adjusts the voltage to be outputted to be higher to increase the quantity of the discharge current of semiconductor device 1. By repeating this process, Vr and Va are maintained at the same value, and a constant discharge current is caused to flow through semiconductor device 1.

As stated above, strictly speaking, it takes a little time for a discharge current to converge to a predetermined value. However, since this time until the predetermined value is converged is adjusted to be a small amount of time that does not matter from the point of the essence of the present disclosure, it can be safely said that a predetermined discharge current is caused to be constant and flow from the start of discharge. Moreover, although a discharge current minutely fluctuates in response to an operation of control circuit 20 during a discharge period, since the fluctuation is not large enough to make a serious influence on the object of the present disclosure, it can be safely said that a predetermined discharge current is caused to be constant and flow during a discharge period in which a pulse signal is inputted to IN terminal 15. The present disclosure takes no account of a little time until a predetermined value is converged or subsequent minor fluctuations, and uses the expressions such as "a discharge current always having a constant value flows" and "a discharge current having a predetermined constant value."

Considering that a discharge current (Ia (A)) having a predetermined value is caused to be constant and flow through semiconductor device 1, predetermined voltage Va that reference voltage generating circuit 22 is capable of outputting is required to be set to Va=Ia×Rr in advance. Here, Rr denotes resistance value Rr (Ω) of resistor 12. Since field-effect transistor 11 and resistor 12 are connected in series in semiconductor device 1, discharge currents having the same value flow through field-effect transistor 11 and resistor 12. Accordingly, a voltage at first contact point 17 is represented by Ia×Rr, and voltage Ia×Rr is inputted to Inverting input terminal 212 of operational amplifier 21. If voltage Va inputted from reference voltage generating circuit 22 to non-inverting input terminal 211 of operational amplifier 21 is set equal to voltage Ia×Rr beforehand, operational amplifier 21 automatically adjusts opening and closing of the gate of field-effect transistor 11, and a predetermined discharge current always having constant value Ia flows through semiconductor device 1. The reason why semiconductor device 1 includes resistor 12 is because the voltage at first contact point 17 is fixed to the same voltage as reference voltage Va by setting resistance value Rr relative to discharge current Ia having a desired predetermined value. In this sense, resistor 12 functions as a sense resistor, and first contact point 17 corresponds to a sensing position on a circuit.

It should be noted that a discharge current flows through semiconductor device 1 only during a period in which control IC 2 transmits a pulse signal to IN terminal 15 of semiconductor device 1. Since discontinuation of input of the pulse signal from IN terminal 15 results in discontinuation of output from output terminal 213 of operational amplifier 21, the gate of field-effect transistor 11 is closed immediately.

As stated above, use of semiconductor device 1 according to the present embodiment allows a discharge current to always have a desired predetermined constant value and to flow, without the influence of various factors. For this reason, it is possible to accurately detect, for discharge of battery 3, a change in voltage with respect to time, which is exceedingly convenient to measure an internal impedance of battery 3.

In the conventional technique, design with a field-effect transistor to only have a switching function for controlling conduction and non-conduction (ON and OFF) of a discharge current, and a conduction resistance value at the time of discharge current conduction (a discharge period) to be as low as possible were required. For this reason, there is a problem that a resistor generates a large amount of heat when the discharge current is conducted, and a temperature of only a portion in which the resistor is disposed in a semiconductor device rises locally. In order for a peak temperature of the semiconductor device to avoid exceeding the preset upper limit, means, such as connecting resistors in parallel and dispersing placement positions of the respective resistors, are taken.

This is because, in the technical field relating to the present disclosure, it is required to minimize the size of semiconductor device 1 to an area of approximately 2.0 mm×4.5 mm while a power loss of at least 3.6 W (a discharge current of 1.2 A, a voltage of 3.0 V of the electric storage device) of semiconductor device 1 occurs due to the discharge from the electric storage device. In addition, it may be required to minimize the size of semiconductor device 1 to an area of approximately 2.0 mm×3.0 mm. In other words, a power loss area ratio obtained by dividing a power loss (W) in semiconductor device 1 at the time of discharge by the area (mm$^2$) of semiconductor device 1 is at least 0.4 (W/mm$^2$). Accordingly, it is important to particularly control the generation of heat at the time of conduction of a discharge current, compared to a case in which the area of semiconductor device 1 can be increased.

The present disclosure is intended to suppress a rise in only maximum temperature (hereinafter also referred to as a peak temperature) of resistor 12, not by reducing a conduction resistance value of field-effect transistor 11 at the time of conduction of a discharge current on purpose, but by intentionally increasing a power loss in field-effect transistor 11. It is desirable that heat generated at the time of the conduction of the discharge current of semiconductor device 1 be preferably dispersed in the plane, and that a peak temperature of field-effect transistor 11 and the peak temperature of resistor 12 become comparable with each other. More specifically, it is desirable that a difference between the peak temperature of field-effect transistor 11 and the peak temperature of resistor 12 be within five degrees Celsius when a discharge current caused to have a predetermined constant value flows through semiconductor device 1. It should be noted that a maximum temperature is a maximum temperature a field-effect transistor portion reaches in a discharge period in which the discharge current caused to have the predetermined constant value flows, the field-effect transistor portion being a region in which field-effect transistor 11 is disposed.

Figure 3A:
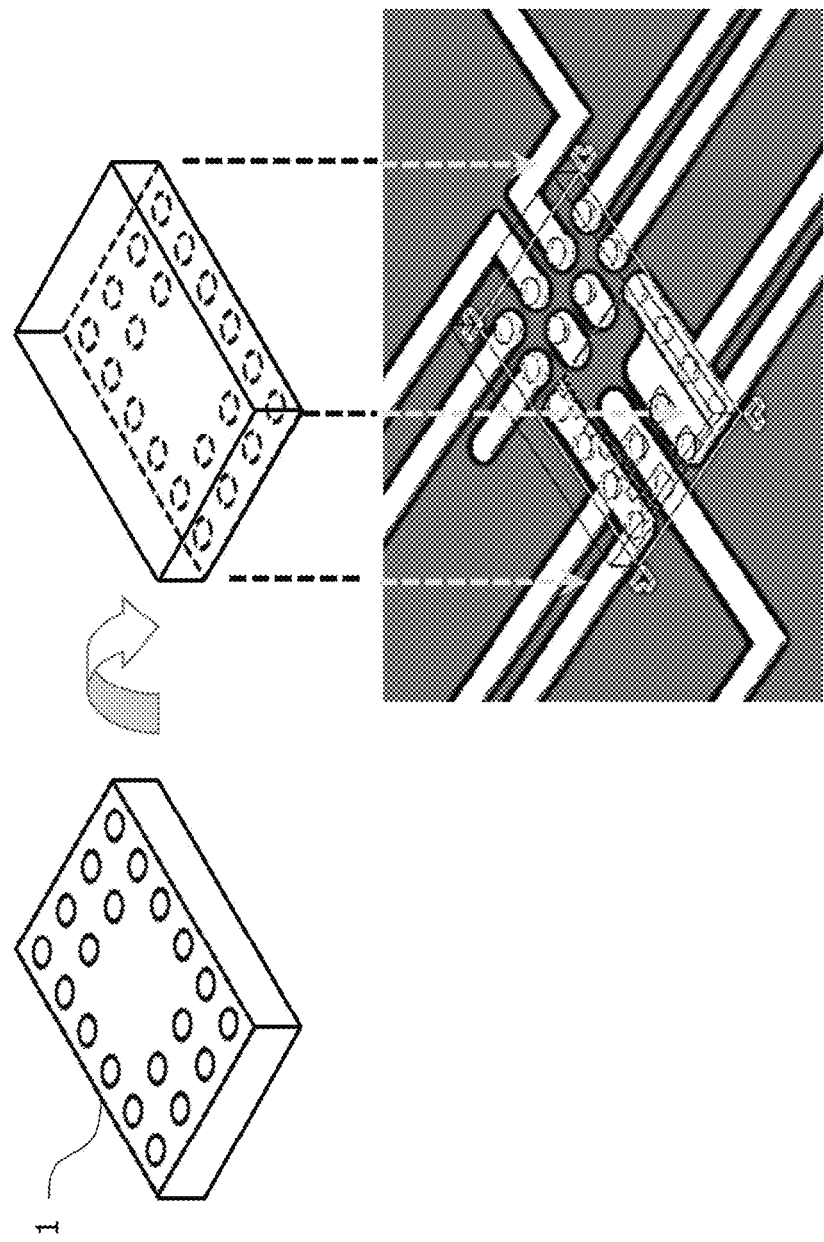
FIG. 3A is a schematic diagram illustrating how the semiconductor device according to Embodiment 1 is mounted.
Figure 3B:
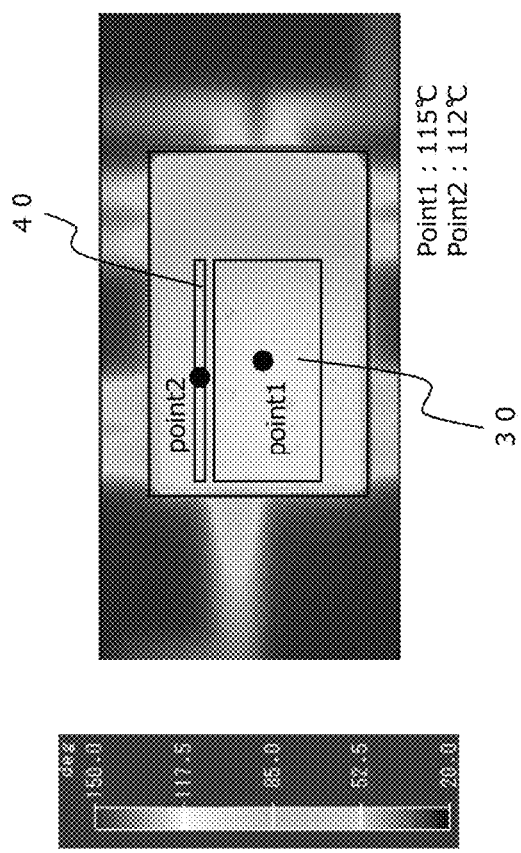
FIG. 3B shows a result of measuring, using a thermographic camera, heat generated by the semiconductor device according to Embodiment 1 mounted on a mounting board, at the time of current conduction.

A peak temperature can be measured using a thermographic camera. It is desirable that the measuring be performed for a period including a discharge period and a period directly after the discharge period. The thermographic camera captures semiconductor device 1 in a plan view and determines the highest temperatures indicated by portions of regions including field-effect transistor 11 and resistor 12, respectively, as respective peak temperatures. FIG. 3B shows an example of a measurement result. As will be mentioned later, in a plan view, semiconductor device 1 includes: field-effect transistor portion (also referred to as switch region) 30 that is a region in which field-effect transistor 11 is disposed; and resistor portion (also referred to as resistor region) 40 that is a region in which resistor 12 is disposed. The peak temperature of field-effect transistor 11 is a temperature of a portion (Point 1 in FIG. 3B) that has reached the highest in switch region 30, and the peak temperature of resistor 12 is a temperature of a portion (Point 2 in FIG. 3B) that has reached the highest in resistor region 40. FIG. 3B shows a result when switch region 30 has reached the maximum temperature in the discharge period, and a difference between the maximum temperature of switch region 30 and the peak temperature of resistor region 40 remains at three degrees Celsius.

It should be noted that when semiconductor device 1 reaches a peak temperature, semiconductor device 1 is mounted on an appropriate mounting board and conducted, and often performs the measuring in such a state. FIG. 3A is a schematic diagram illustrating how semiconductor device 1 is mounted. The mounting is performed by bonding external connection terminals of semiconductor device 1 to the mounting board via a material such as solder. A board is preferably a printed circuit board (PCB), and it is desirable that since semiconductor device 1 includes the external connection terminals having various functions, wirings corresponding to the external connection terminals be provided on to the mounting board.

Moreover, by controlling a conduction resistance value of field-effect transistor 11, a temperature of field-effect transistor portion 30 when it reaches its maximum during a discharge period, in which a discharge current caused to have a predetermined constant value flows through semiconductor device 1, may be adjusted to be higher than a temperature of resistor portion 40. Although the peak temperature is likely to rise in resistor 12, the present embodiment takes a measure such that the peak temperature of field-effect transistor 11 becomes higher than the peak temperature of resistor 12.

The measure is to make the conduction resistance value of field-effect transistor 11 when the discharge current flows through semiconductor device 1 higher than a resistance value of resistor 12. A conduction resistance value is, for example, conduction resistance value Ron (Ω) of field-effect transistor 11 when minimum voltage Vmin (V) in operating specification is applied semiconductor device 1. It should be noted that a discharge current is caused to have constant value Ia (A). Since discharge is normally performed at a voltage higher than or equal to Vmin (a discharge current is caused to have constant value Ia), a conduction resistance value becomes a value greater than or equal to Ron (Ω). Accordingly, if the resistance value of resistor 12 is Rr (Ω), it should be Ron (Ω)>Rr (Ω). It should be noted that since the present embodiment is intended to disperse the generated heat in the plane of semiconductor device 1 in the discharge period, it is not always necessary to increase the peak temperature of field-effect transistor 11, compared to the temperature of resistor 12. In addition, it is desirable that semiconductor device 1 include external resistor terminal (R terminal) 16 that is an external connection terminal in order to measure a resistance value of resistor 12.

Figure 4:
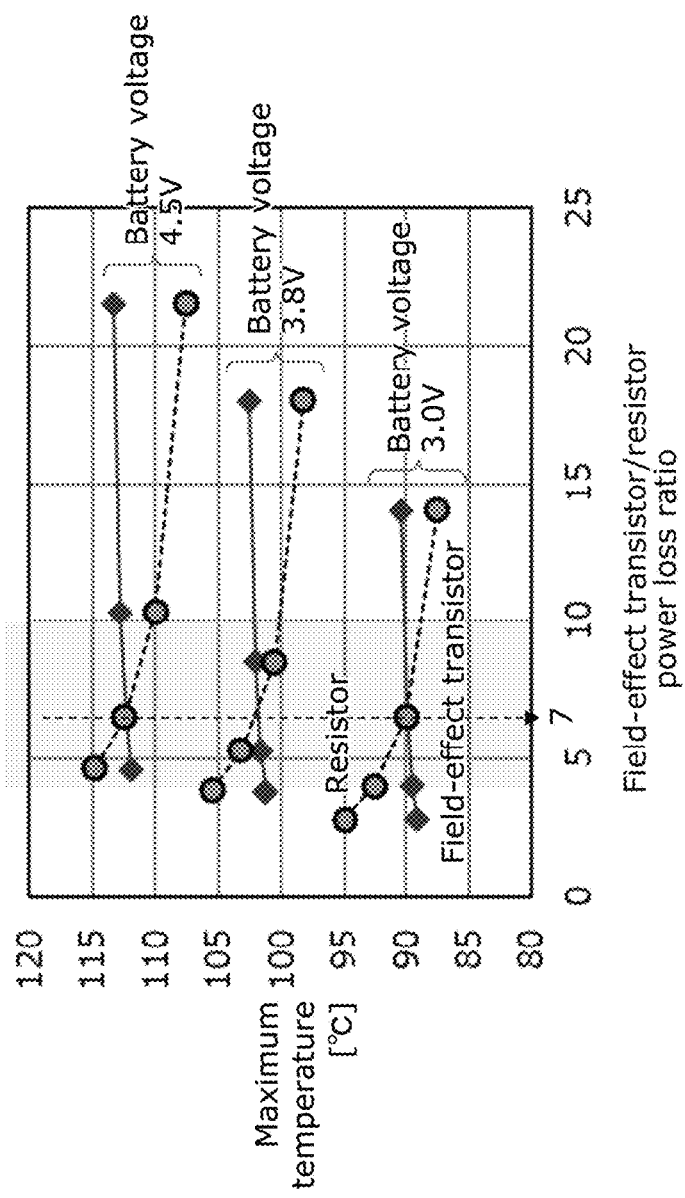
FIG. 4 is a graph Illustrating a result of simulating a maximum temperature of each of a field-effect transistor and a resistor included in the semiconductor device according to Embodiment 1.

Since the peak temperatures of field-effect transistor 11 and resistor 12 are influenced not only by a resistance value of each of field-effect transistor 11 and resistor 12 but also by ease of heat dissipation, the peak temperatures depend on, for example, a unit structure and arrangement of each of field-effect transistor 11 and resistor 12, other constituent elements surrounding field-effect transistor 11 and resistor 12, and spaces between field-effect transistor 11 and resistor 12 and the other constituent elements. As a result of intensive study, the inventors discovered that a conduction resistance value of field-effect transistor 11 is preferably at least four times and less than ten times a resistance value of resistor 12 in semiconductor device 1 having such a configuration as shown in FIG. 5B. FIG. 4 shows the result of the study. The horizontal axis represents a ratio of power consumption (=Ia^2×Ron) of field-effect transistor 11 to power consumption (=Ia^2×Rr) of resistor 12, where the value of a discharge current caused to be constant is denoted by Ia (A). The vertical axis represents a peak temperature of each of field-effect transistor 11 and resistor 12.

Although the peak temperatures change according to an applied voltage (shown as battery voltage in FIG. 4) between D terminal 13 and S terminal 14, when both of the peak temperatures move leftward with reference to the horizontal axis, that is, the power consumption of field-effect transistor 11 decreases, the power consumption of resistor 12 relatively increases, and the peak temperature of resistor 12 rapidly rises. When the peak temperatures move rightward with reference to the horizontal axis, that is, the power consumption of field-effect transistor 11 increases, the power consumption of resistor 12 relatively decreases, and the peak temperature of resistor 12 drops. That the change in the peak temperature of resistor 12 is rapid while the change in the peak temperature of field-effect transistor 11 is gradual will be described later.

It is clear from FIG. 4 that when the horizontal axis indicates approximately 7.0 (=the power consumption of field-effect transistor 11 is seven times the power consumption of resistor 12), the peak temperatures of field-effect transistor 11 and resistor 12 become substantially same. In order for a difference between the peak temperatures of field-effect transistor 11 and resistor 12 to be less than or equal to five degrees Celsius when a discharge current caused to be constant flows, the power consumption of field-effect transistor 11 is required to be approximately at least four times and less than ten times the power consumption of resistor 12 without depending on the applied voltage between D terminal 13 and S terminal 14. In other words, it is desirable that the conduction resistance value of field-effect transistor 11 be at least four times and less than ten times the resistance value of resistor 12.

The peak temperature of resistor 12 rises when the scale factor (i.e., the ratio of the power consumption of field-effect transistor 11 to the power consumption of resistor 12) falls below four times, and causing the discharge current to be constant may be interfered due to the influence of the temperature characteristics of resistor 12. Conversely, the peak temperature of field-effect transistor 11 rises when the scale factor surpasses ten times, and the switching function may become unstable. In other words, 4×Rr≤Ron<10×Rr is desirable. Although reducing the resistance value of resistor 12 is effective, since the detection of a reference voltage as a sense resistance may become unstable when the resistance value falls below 0.2Ω, it is desirable that the resistance value be greater than or equal to 0.2Ω.

With regard to the placement order of field-effect transistor 11 and resistor 12 that are connected in series relative to the discharge current, Embodiment 1 has described the example in which field-effect transistor 11 is located upstream and resistor 12 is located downstream. Only voltage Vr at first contact point 17 between field-effect transistor 11 and resistor 12 is transferred to operational amplifier 21 in order to keep the discharge current constant. This is possible because the downstream of resistor 12 is grounded as shown in FIG. 2A. If the downstream of resistor 12 is not grounded, it will be necessary to provide a second contact point (not shown in FIG. 2A) in the downstream of resistor 12, detect a voltage at first contact point 17 and a voltage at the second contact point, and transmit a difference between the voltages to operational amplifier 21. Since the downstream of resistor 12 can be easily grounded or is required to be grounded due to circuit design, placing resistor 12 downstream eliminates the need to transfer any voltage to operational amplifier 21 but voltage Vr at first contact point 17. For this reason, it is desirable that field-effect transistor 11 be located upstream and resistor 12 be located downstream.

It is also possible to place resistor 12 upstream and field-effect transistor 11 downstream. Even such a placement makes it possible to produce the same effect of causing the peak temperatures in the discharge period to be comparable with each other (s five degrees Celsius). In this regard, however, it will be necessary to provide a second contact point in the upstream of resistor 12, detect a voltage at first contact point 17 and a voltage at the second contact point, and transmit a difference between the voltages to operational amplifier 21. Alternatively, measures such as appropriately providing a ground point may be taken.

The description of Embodiment 1 continues to use the example in which field-effect transistor 11 and resistor 12 are connected in series relative to the flow of the discharge current so that field-effect transistor 11 is located upstream and resistor 12 is located downstream.

(Physical Characteristics of Semiconductor Device)

It is desirable that, as schematically shown in FIG. 5A, semiconductor device 1 according to the present embodiment be rectangular in shape such that, when a direction in which a discharge current flows is a first direction and a direction orthogonal to the first direction is a second direction in a plan view, a direction parallel to the shorter sides of semiconductor device 1 (hereinafter may be referred to as a shorter-side direction) is the first direction, and a direction parallel to the longer sides of semiconductor device 1 (hereinafter may be referred to as a longer-side direction) is the second direction. Semiconductor device 1 is divided into conduction region 100 and control region 200 adjacent to each other in a plan view. A discharge current flows through conduction region 100, whereas a discharge current does not flow through control region 200 including control circuit 20. It should be noted that a peripheral portion of conduction region 100 and control region 200 may include a marginal region designed to have no electrical functions. Moreover, a discharge current in the present disclosure is a current caused to flow by discharge from the electric storage device as schematically shown by solid-white arrows in FIG. 5A, and indicates a current caused to have a predetermined constant value by the function of control circuit 20. Although a discharge current does not flow through control region 200, a current as a signal for driving control circuit 20 or a leak current etc. may flow through control region 200.

Conduction region 100 includes: switch region (also referred to as field-effect transistor portion) 30 in which field-effect transistor 11 having a switching function of switching a discharge current between ON and OFF is disposed; and resistor region (also referred to as resistor portion) 40 in which resistor 12 connected in series to field-effect transistor 11 is disposed. Additionally, the surface of semiconductor device 1 includes a plurality of external connection terminals bonded to the outside via a material such as solder when semiconductor device 1 is mounted face-down on a mounting board. There are many types of the plurality of external connection terminals with different functions. Conduction region 100 includes D terminals 13 that are a plurality of Inflow terminals into which a discharge current flows, and S terminals 14 that are a plurality of outflow terminals out of which a discharge current flows. In addition, conduction region 100 includes R terminals 16 that are external resistor terminals under certain circumstances. A part or all of the plurality of inflow terminals (D terminals 13) are arranged along one longer side 91 of semiconductor device 1, and a part or all of the outflow terminals (S terminals 14) are arranged along other longer side 92 of semiconductor device 1. For this reason, field-effect transistor 11 and resistor 12 are connected in series in stated order between the plurality of inflow terminals (D terminals 13) and the plurality of outflow terminals (S terminals 14). It should be noted that a current other than a discharge current may flow through the plurality of inflow terminals and the plurality of outflow terminals.

Conduction region 100 is required to use the area thereof effectively when conducting a discharge current. For this reason, it is desirable that the length of each of switch region 30 and resistance region 40 in the second direction match the length of conduction region 100 in the second direction. It is desirable that, at least in a plan view, switch region 30 and control region 200 have a neighboring region along the first direction, switch region 30 and control region 200 being arranged in the second direction orthogonal to the first direction. In other words, it is further desirable that conduction region 100 and control region 200 be divided by a virtual boundary line parallel to the shorter sides of semiconductor device 1. The virtual boundary line indicates the outermost perimeter of a region in which field-effect transistor 11 conducts a discharge current. In semiconductor device 1, the virtual boundary line Indicates the outermost perimeter of a region in which field-effect transistor 11 located at the outmost perimeter of switch region 30 conducts a discharge current.

Control region 200 includes control circuit 20 that keeps constant a discharge current flowing through conduction region 100 without depending on an applied voltage between the plurality of inflow terminals (D terminals 13) and the plurality of outflow terminals (S terminals 14). Accordingly, a discharge current does not flow through control region 200. Control circuit 20 includes various types of functional circuits including at least operational amplifier 21 and reference voltage generating circuit 22. Moreover, the surface of control region 200 includes a plurality of external connection terminals through which signals, currents, and voltages are inputted to or outputted from those functional circuits, and IN terminal 15 that is a control terminal. Control terminal (IN terminal) 15 is electrically connected to the gate electrode of field-effect transistor 11 located in conduction region 100. The input of a pulse signal to IN terminal 15 from the outside is linked to ON and OFF of the discharge current flowing through conduction region 100. Consequently, control terminal 15 controls a discharge period for the discharge current flowing through semiconductor device 1.

Although the value of a discharge current changes depending on the number of electric storage devices to be discharged, the capacity of an electric storage device, etc., the value of the discharge current may be required to be approximately several amperes. For this reason, the area of conduction region 100 through which a discharge current flows is made larger than the area of control region 200 through which a discharge current does not flow. Moreover, it is required to arrange conduction region 100 and control region 200 so that the shorter-side direction of semiconductor device 1 is the first direction and the longer-side direction of semiconductor device 1 is the second direction in a plan view of semiconductor device 1. Such an arrangement makes it possible to expand a width in which a discharge current flows and to reduce a length over which the discharge current flows, which is convenient to conduct a large current.

In FIG. 5A, control region 200 is disposed close to one end of the longer side of semiconductor device 1 (other shorter side 94 in FIG. 5A), and the remaining portion is disposed as conduction region 100. It is desirable that boundary line 90 between conduction region 100 and control region 200 extend straight from one longer side 91 to other longer side 92 of semiconductor device 1 in a plan view so as to be parallel to the first direction.

The reason why control region 200 is disposed close to the one end of the longer side of semiconductor device 1 in a plan view is because it is intended to prevent control region 200 from becoming an obstacle to the flow of a discharge current. This allows the discharge current to flow longitudinally through semiconductor device 1 in the shorter-side direction of semiconductor device 1 from one longer side 91 to other longer side 92 of semiconductor device 1 in a plan view. At this time, if the entire width of conduction region 100 in the longer-side direction of semiconductor device 1 is applied for a discharge current flow, it is also convenient in case a discharge current increases.

The reason why control region 200 is disposed so as not to become an obstacle to the flow of a discharge current is because the area of control region 200 relative to the area of semiconductor device 1 is too large to disregard. In the present embodiment, since control region 200 includes control circuit 20 having a feedback function, control region 200 requires a certain amount of area. Moreover, although it is necessary to change the area of conduction region 100 depending on a desired value of a discharge current, the area of control region 200 is at least one-sixth and less than one-half the area of semiconductor device 1. Although the area of control region 200 also depends on functions to be included, the area of control region 200 typically needs approximately one-third the area of semiconductor device 1. Accordingly, it is important to appropriately dispose control region 200 to avoid obstructing the flow of a discharge current in conduction region 100.

Figure 5C:
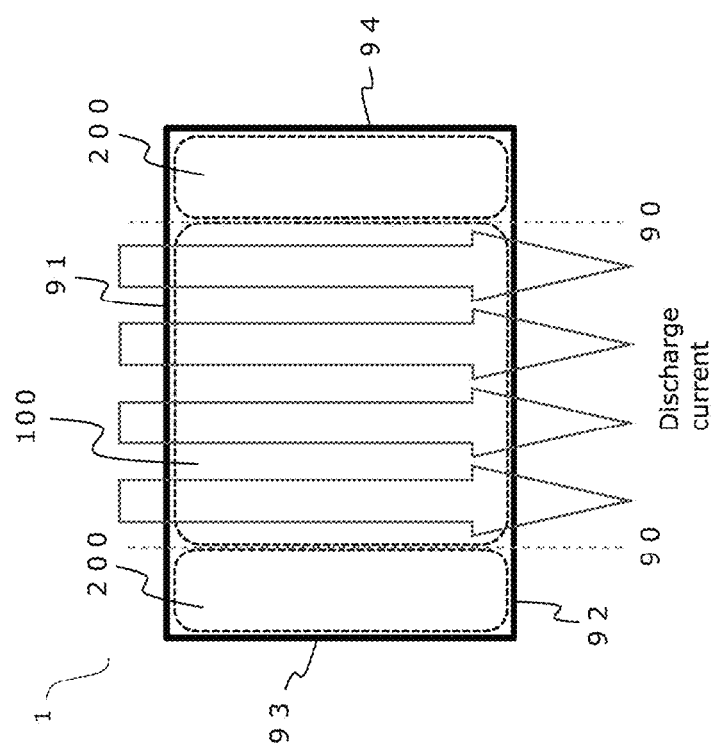
FIG. 5C is a plan view illustrating an example of a structure of the semiconductor device according to Embodiment 1.
Figure 5D:
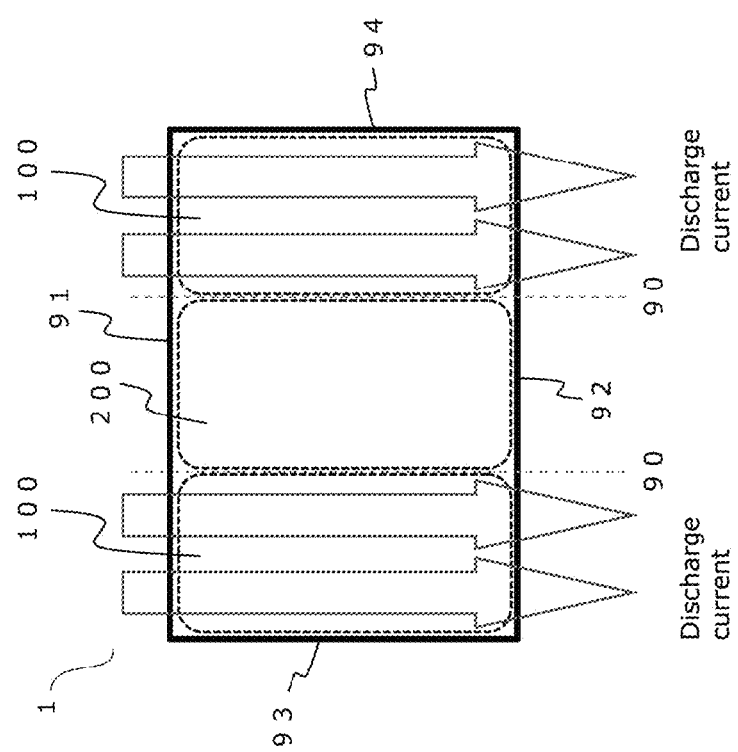
FIG. 5D is a plan view illustrating an example of a structure of the semiconductor device according to Embodiment 1.

In this sense, how to dispose conduction region 100 and control region 200 is not limited to the example shown in FIG. 5A. As shown in FIG. 5C, in a plan view, conduction region 100 may be disposed in a central part in the longer-side direction, and control region 200 may be disposed at both ends in the longer-side direction. As shown in FIG. 5A, in a plan view, conduction region 100 may be disposed at one end in the longer-side direction, and control region 200 may be disposed at another end in the longer-side direction. Additionally, as shown in FIG. 5D, in a plan view, control region 200 may be disposed in a central part in the longer-side direction, and conduction region 100 may be disposed at the both ends in the longer-side direction. In any case, in order to prevent control region 200 from becoming an obstacle to the flow of a discharge current in conduction region 100, even when boundary lines 90 are present between conduction regions 100 and control regions 200, it is desirable that each of boundary lines 90 extend straight from one longer side 91 to other longer side 92 of semiconductor device 1 in a plan view.

The discharge current flowing longitudinally through conduction region 100 flows in from D terminal 13 and flows out to S terminal 14 via field-effect transistor 11 disposed in switch region 30 and resistor 12 disposed in resistor region 40. For this reason, it is desirable that D terminal 13, switch region 30, resistor region 40, and S terminal 14 be disposed in conduction region 100 in stated order along the first direction because such a configuration allows a discharge current to smoothly flow in a straight line. It is desirable that semiconductor device 1 include at least a plurality of external connection terminals exposed to the surface, a plurality of inflow terminals (D terminals 13) and a plurality of outflow terminals (S terminals 14) be included in the plurality of external connection terminals, and field-effect transistor 11 and resistor 12 be disposed on an inflow terminal (D terminal 13) side and an outflow terminal (S terminal 14) side, respectively, in the shorter-side direction in a plan view.

Moreover, it is desirable that switch region 30 have a length in the second direction greater than a length in the first direction in a plan view. Such a shape makes it possible to increase a width in which a discharge current is conducted, which is convenient to pass a large current. In addition, as will be mentioned later, such a shape also produces an effect of making field-effect transistor 11 disposed in switch region 30 easy to use uniformly in a plane.

It is desirable that, among the constituent elements of conduction region 100, switch region 30 account for the largest share of the area of conduction region 100 in order to conduct a large current. Accordingly, it is desirable that resistor region 40 be disposed in a position closer to S terminals 14 than to a position at which the shorter sides of semiconductor device 1 are divided in half in the first direction in a plan view. Moreover, as previously mentioned, it is desirable that field-effect transistor 11 and resistor 12 be located upstream and downstream, respectively, relative to the flow of a discharge current. Resistor region 40 disposed in the position closer to S terminals 14 is convenient in this sense as well.

A large area of switch region 30 makes it possible to efficiently dissipate heat generated in a discharge period, and produces an effect of suppressing a rise in peak temperature. FIG. 4 shows that the peak temperature of field-effect transistor 11 changes more gradually than the peak temperature of resistor 12. This is due to switch region 30 having the large area and relatively favorable heat dissipation. For this reason, a conduction resistance value of field-effect transistor 11 when a discharge current is conducted may be large to some extent.

The present embodiment is intended to suppress an increase only in peak temperature of resistor 12 by intentionally increasing the power consumption of field-effect transistor 11. Since resistor region 40 is small in area and poor in heat dissipation, even if resistance Rr ($\Omega$) is kept low, the peak temperature is predisposed to rise. In order to cause switch region 30 to have an approximately same peak temperature, it is desirable that, in consideration of the area size of switch region 30, that is, ease of heat dissipation, conduction resistance value Ron ($\Omega$) be increased to match resistance Rr ($\Omega$). Accordingly, it is desirable that, regarding switch region 30 and resistor region 40, an area ratio and a resistance ratio be in proportion to each other. In other words, it is desirable that a ratio of the area (Sr) of resistor region 40 to the area (Ssw) of switch region 30 be substantially equal to a ratio of resistance Rr ($\Omega$) of resistor 12 to conduction resistance value Ron ($\Omega$) of field-effect transistor 11 when minimum voltage Vmin (V) in operating specification (a discharge current caused to be constantly at Ia (A)) is applied to semiconductor device 1. To put it another way, the following relationship is established: $Sr/Ssw \approx Rr/Ron$.

Here, the term substantially equal indicates that one is in a range from 0.5 to 1.5 times greater than the other. This is because the heat dissipation is not only attributable to an area, and therefore, regarding switch region 30 and resistor region 40, the area ratio and the resistance ratio need not be strictly proportional. Switch region 30 may partially include a portion in which field-effect transistor 11 is not disposed, and the portion in which field-effect transistor 11 is not disposed may be included or need not be included in calculating an area. As will be mentioned later, the portion in which field-effect transistor 11 is not disposed may be the same as a location in which an external connection terminal is disposed.

In order to pass a discharge current longitudinally through conduction region 100 using the entire width of conduction region 100 in the second direction, unit cells of field-effect transistor 11 may be spread over the substantially entire surface of switch region 30. It is desirable that the unit cells of field-effect transistor 11 be lateral field-effect transistors in each of which a channel is horizontal. Although the unit cells of field-effect transistor 11 may be vertical field-effect transistors in each of which a channel is vertical, when semiconductor device 1 is large in thickness, there is a possibility that a path on which a discharge current flows becomes relatively longer. If not otherwise specified, the following description assumes that field-effect transistor 11 includes lateral field-effect transistors.

Figure 6B:
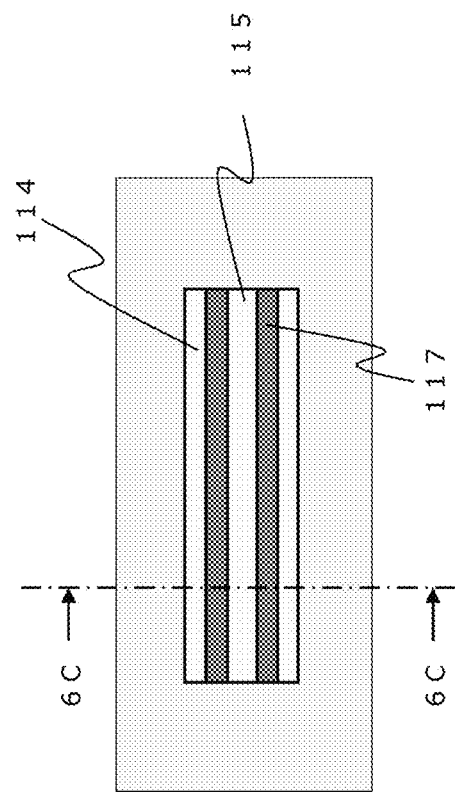
FIG. 6B Is a plan view illustrating an example of a structure of unit cells of the field-effect transistor included in the semiconductor device according to Embodiment 1.

As shown in FIG. 6A, in switch region 30, field-effect transistor 11 includes an aggregate in which the unit cells are arranged. FIG. 6B is a plan view illustrating an example of a structure of the unit cells, and FIG. 6C is a cross-sectional view of the portion along line 6C-6C shown in FIG. 6B.

It is desirable that each of the unit cells contribute evenly to current conduction. For this reason, it is desirable that a drain wiring connected to the drain electrode of the unit cell and a source wiring connected to the source electrode of the unit cell be disposed so that the drain wiring and the source wring are free of the influence of a difference in disposed positions of the unit cells as much as possible. This is because the drain wiring and the source wiring also have a resistance, and a resistance resulting from the extension of the wirings is added to the resistance of the drain wiring and the source wiring connected to a unit cell disposed in a position at which a distance for connection to the constituent elements upstream and downstream is relatively long. Since a voltage at first contact point 17 between field-effect transistor 11 and resistor 12 is transferred to control circuit 20 included in control region 200, when the influence of wiring resistance appears for each of the unit cells of field-effect transistor 11, there is a possibility that control circuit 20 that causes a discharge current to be constant dose not sufficiently function.

As shown in FIG. 6D, it is desirable that, in a plan view, drain wiring 118 and source wiring 119 each include portions alternately arranged in the second direction and forming a comb shape, drain wiring 118 connecting D terminal 13 and the drain electrode of field-effect transistor 11, source wiring 119 connecting the source electrode of field-effect transistor 11 and resistor 12. It is also desirable that a sum of unit widths of the portions of each of drain wiring 118 and source wiring 119 in the second direction be substantially equal to a length of the longer side of each of the unit cells of field-effect transistor 11. It should be noted that the term substantially equal is used in consideration of providing a margin (space) so that drain wiring 118 and source wiring 119 are not in contact with each other. In other words, it is desirable that, if the sum of the unit widths of the portions of each of drain wiring 118 and source wiring 119 forming the comb shape in the second direction includes the provided margin, the sum be equal to the length of the longer side of each of the unit cells of field-effect transistor 11.

The portions of drain wiring 118 forming the comb shape are integrated on one longer side 91 of semiconductor device 1 in the first direction, and a portion exposed in the integrated part is D terminal 13. For this reason, a discharge current flowing in from D terminal 13 is evenly transmitted to each of the portions forming the comb shape via the integrated part of drain wiring 118 immediately below D terminal 13. Likewise, the portions of source wiring 119 forming the comb shape are integrated on other longer side 92 of semiconductor device 1 in the first direction, and the integrated part is in contact with resistor 12. Accordingly, a discharge current flowing through each of the portions of source wiring 119 forming the comb shape is evenly transmitted to resistor 12 via the integrated part.

Such an arrangement of drain wiring 118 and source wiring 119 makes it possible to connect, for each of columns of unit cells arranged as shown in FIG. 6A, the unit cells and the constituent elements upstream and downstream at a physically equal length. It should be noted that the unit widths of the portions of drain wiring 118 forming the comb shape need not be equal to each other, and the unit widths of the portions of source wiring 119 forming the comb shape need not be equal to each other. Moreover, when a portion in which field-effect transistor 11 is not disposed is provided in switch region 30, there may be, among the portions forming the comb shape, a portion that changes its extension direction from the first direction to another direction, to avoid the previously mentioned portion.

Even with a wiring pattern as shown in FIG. 6D, for both drain wiring 118 and source wiring 119, a unit cell closest to a D terminal 13 side and a unit cell closest to an S terminal 14 side are not strictly equal in wiring resistance, resulting in difference in wiring resistance along each column (i.e., the first direction). However, causing both conduction region 100 and switch region 30 to be in a shape in which a length in the second direction is greater than a length in the first direction makes it possible to keep a difference in wiring resistance at a certain level in the first direction, and thus control circuit 20 is more likely to function unhindered. This is because, as stated earlier, increasing the length of switch region 30 in the second direction produces an effect of making field-effect transistor 11 easy to use uniformly and without bias in a plane. It is desirable that the length of switch region 30 in the first direction not be increased excessively.

Field-effect transistor 11 may include fingers of the unit cells arranged in a direction parallel to the second direction in a plan view, and the unit cells may be rectangular in shape in which the longer sides of semiconductor device 1 and the direction of the fingers are parallel. Here, the direction of the fingers indicates a direction in which a gate structure of the unit cells extends, and a discharge current flows in a direction orthogonal to the direction of the fingers in a plan view. Although, when the unit cells are rectangular in shape, a direction of the longer sides may be the first direction or the second direction, arranging the unit cells in parallel with the second direction makes it possible to relatively increase the width of the portions of each of drain wiring 118 and source wiring 119 forming the comb shape. Such an arrangement makes it possible to reduce a resistance of the portions forming the comb shape, and to further reduce the influence of differences in wiring resistance occurring in the columns of the unit cells along the first direction.

It is desirable that semiconductor device 1 have a certain breakdown voltage higher than a voltage when the electric storage device to be discharged is charged to the maximum level. This is because when the electric storage device is charged, there is, for example, a case in which a high voltage is applied in a fast-charging mode. It is desirable that field-effect transistor 11 be designed in accordance with an assumed breakdown voltage. As shown in FIG. 6B and FIG. 6C, when a high breakdown voltage is required, it is desirable that field-effect transistor 11 be surrounded by a wider periphery compared to a conduction region (gate structure) in a unit cell and include a structure for increasing a breakdown voltage.

Drain wiring 118 is connected to D terminals 13, and source wiring 119 is connected to S terminals 14 via resistor 12. As shown in FIG. 5B, D terminals 13 are disposed in a plan view, and none of a plurality of external connection terminals is disposed between some of D terminals 13 and one longer side 91 of semiconductor device 1. D terminals 13 may all be circular in shape of the same size, and it is desirable that, among D terminals 13, those closest to one longer side 91 of semiconductor device 1 be disposed evenly at regular intervals across the entire width of conduction region 100 in the second direction. Such an arrangement facilitates the effective use of the entire width of conduction region 100 in the second direction for conducting a discharge current.

Similarly, S terminals 14 are disposed in a plan view, and none of plurality of external connection terminals is disposed between some of S terminals 14 and other longer side 92 of semiconductor device 1. S terminals 14 may all be circular in shape of the same size, and it is desirable that, among S terminals 14, those closest to other longer side 92 of semiconductor device 1 be disposed evenly at regular intervals across the entire width of conduction region 100 in the second direction. Such an arrangement facilitates the effective use of the entire width of conduction region 100 in the second direction for conducting a discharge current. Additionally, this arrangement produces an effect of allowing a discharge current to easily flow from one longer side 91 to other longer side 92 longitudinally through conduction region 100 along the first direction.

Moreover, it is desirable that some of D terminals 13 and some of S terminals are paired in a stripe-shaped region along the first direction, D terminals 13 being a plurality of inflow terminals into which a discharge current flows, S terminals being a plurality of outflow terminals out of which a discharge current flows. Here, the stripe-shaped region indicates a region fit within a certain width in a direction. Such an arrangement can further enhance the effect of facilitating the effective use of the entire width of conduction region 100 along the second direction for conducting a discharge current.

Both D terminals 13 and S terminals 14 are not limited to be circular in shape. As shown in FIG. 7B, a terminal may be shaped into rounded rectangle by joining part of adjacent terminals having the same function, such as D terminals or S terminals, and replacing a space between the D terminals or the S terminals with part of a D terminal or part of an S terminal. Such a configuration expands the physical area of the plurality of external connection terminals bonded to the outside via a material such as solder, which is effective in conducting a larger discharge current and improving the heat dissipation effect.

Figure 7A:
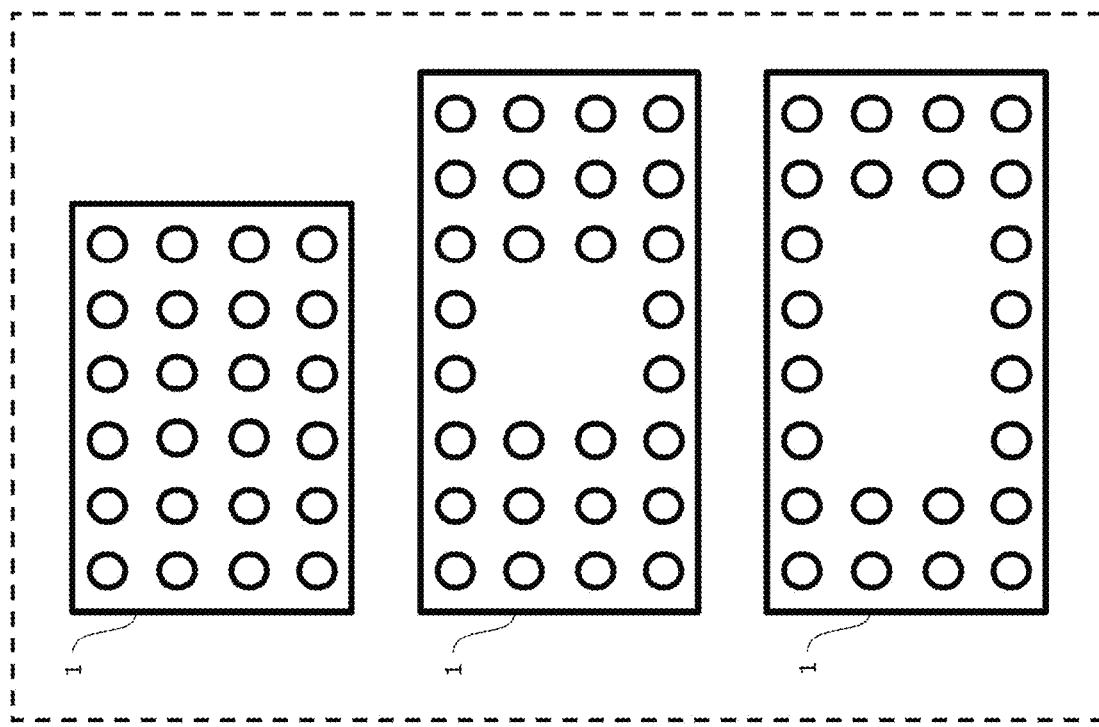
FIG. 7A is a plan view illustrating examples of a structure of the semiconductor device according to Embodiment 1.

It is desirable that, from various viewpoints such as an increase in discharge current, a reduction of mounting failure, heat dispersion, and high heat dissipation, the plurality of external connection terminals be circular or rounded rectangular in shape and be arranged in lattice positions evenly spaced and parallel to the shorter-side direction and the longer-side direction in a plan view. Such an arrangement makes it possible to prevent biased stress from occurring in a plane especially when semiconductor device 1 is mounted. Moreover, the plurality of external connection terminals may be circular or rounded rectangular in shape, and the plurality of external connection terminals need not be arranged in a position that is different from, among lattice positions evenly spaced and arranged in parallel with the shorter-side direction and the longer-side direction, first-row positions or second-row positions equidistant from one longer side 91 and other longer side 92 of semiconductor device 1 and aligned in the longer-side direction, and first-column positions or second-column positions equidistant from one shorter side 93 and other shorter side 94 of semiconductor device 1 and aligned in the shorter-side direction. Such an arrangement produces an effect of especially facilitating the increasing of a discharge current. FIG. 7A and FIG. 7B show desirable examples of the arrangement of the plurality of external connection terminals.

It is desirable that switch region 30 be disposed between D terminals 13 and S terminals 14 in a plan view. This is to facilitate the flow of discharge current from D terminals 13 through field-effect transistor 11 to S terminals 14 to be smooth in one direction. At this time, field-effect transistor 11 may be provided between D terminals 13 or S terminals 14 along the second direction of semiconductor device 1 in a plan view. Moreover, it is desirable that field-effect transistor 11 be disposed in a position close to control region 200 through which a discharge current does not flow, because such a disposition makes it easy to dissipate heat generated in a discharge period toward a control region 200 side. This is because control region 200 does not generate heat since a discharge current does not flow through control region 200 from the beginning, and control region 200 can be used to dissipate heat due to control region 200 having a relatively low temperature, compared to conduction region 100.

In other words, it is desirable that switch region 30 have a portion arranged between some of the plurality of inflow terminals (D terminals 13) and some of the plurality of outflow terminals (S terminals 14) and close to control region 200, the some of the plurality of inflow terminals and the some of the plurality of outflow terminals being paired in a stripe-shaped region.

In Embodiment 1, resistor 12 is connected to the downstream of field-effect transistor 11, and a discharge current is conducted from field-effect transistor 11 toward resistor 12. In FIG. 5B, the discharge current flowing in from D terminal 13 passes through field-effect transistor 11 and resistor 12 to S terminal 14. It is desirable that resistor 12 be disposed in conduction region 100, between field-effect transistor 11 and S terminal 14. Such a disposition allows the flow of discharge current to be smooth in the first direction in a plan view.

Resistor region 40 including resistor 12 is merely one part of conduction region 100. In the present embodiment, although switch region 30 including field-effect transistor 11 is also intentionally caused to have a power loss, since resistor region 40 has a smaller area than switch region 30 does, a peak temperature of resistor region 40 is likely to rise locally. Accordingly, it is desirable that resistor region 40 be in a shape in which the entire width of conduction region 100 along the second direction is a conduction width, and suppress a rise in peak temperature due to the current conduction as much as possible. Such an arrangement produces an effect of bringing resistor 12 close to control region 200 that does not generate heat, and facilitates dissipating heat to control region 200. Moreover, instead of single resistor 12, a plurality of identically-shaped resistors 12 may be provided. At this time, it is desirable that the plurality of resistors 12 each use the entire width of conduction region 100 in the second direction as a conduction width for a discharge current, and be arranged in a stripe pattern in the first direction.

Even when the plurality of resistors 12 are arranged in parallel, it is desirable that resistors 12 each have a length of at most 15 µm in the first direction. To put it another way, it is desirable that one or more identically-shaped resistors 12 be connected in parallel with each other and arranged in resistor region 40 in a plan view, one or more resistors 12 each having a conduction width for a discharge current that matches the length of conduction region 100 in the second direction, and a conduction length of at most 15 µm for the discharge current. Such an arrangement makes it possible to keep the rise in peak temperature of one or more resistors 12 relatively low in a discharge period.

Such a shape of resistor 12 is intended to suppress a resistance value as much as possible. As shown in FIG. 4, this is because resistor 12 has a tendency to rapidly raise a temperature with an increase in power loss, compared to field-effect transistor 11. Although it is desirable that the peak temperatures of field-effect transistor 11 and resistor 12 become substantially same (≤ five degrees Celsius), it is necessary to design a resistance value of resistor 12 in consideration of how a temperature easily rises in resistor 12.

FIG. 4 shows that the peak temperatures of field-effect transistor 11 and resistor 12 become substantially same when the power consumption of field-effect transistor 11 is approximately seven times the power consumption of resistor 12. A relation in which the peak temperatures of field-effect transistor 11 and resistor 12 become substantially same when a power loss occurring in resistor 12 is maximum is expressed in equation. The power loss seems to be maximum when semiconductor device 1 is driven at a maximum voltage in operating specification and a maximum current in operating specification. The peak temperatures become substantially same when $(Imax^2) \times Ronmax = 7 \times (Imax^2) \times Rrmax$ is satisfied, where Ronmax (Ω) denotes a conduction resistance value of field-effect transistor 11 and Rrmax (Ω) denotes a resistance value of resistor 12, both when semiconductor device 1 is driven at maximum voltage Vmax (V) in operating specification and maximum current Imax (A) in operating specification.

It is desirable that the resistance value of resistor 12 be set not to exceed Rrmax in consideration of the influence of manufacturing variations. Assuming that manufacturing variations are ±20%, it is desirable that target value Rr (Ω) of the resistance value of resistor 12 be set as $Rrmax = 1.2 \times Rr$. Even if maximum manufacturing variations occur, and there are drive conditions under which the maximum power loss occurs in semiconductor device 1, such setting makes it possible to prevent the peak temperature of resistor 12 from exceeding a temperature of field-effect transistor 11 by more than five degrees Celsius.

Since the value of Rr is often less than 1Ω although depending on the value of Vmax and Imax, it is desirable that the conduction width of resistor 12 be increased as much as possible, and at the same time the conduction length of resistor 12 be decreased as much as possible. For this reason, it is desirable that resistor 12 be shaped as described above. Though stated above, since a resistance value has a lower detection limit, excessively decreasing the conduction length may make it impossible to detect the resistance value.

It should be noted that external resistor terminal (R terminal) 16 may be provided close to resistor 12. With this configuration, it is possible to dissipate not only heat generated in field-effect transistor 11 but also heat generated in resistor 12 via external resistor terminal 16. Additionally, it is possible to test a resistance value of resistor 12 during manufacturing, using external resistor terminal 16.

The plurality of external connection terminals are portions bonded to the mounting board via a material such as solder. There is a possibility that device functional portions such as field-effect transistor 11, resistor 12, or control circuit 20 are damaged due to the bonding pressure, the warp caused by the influence of heat, etc. when semiconductor device 1 is mounted. Accordingly, a structure may be designed so that a semiconductor layer having a device function is not provided immediately below the plurality of external connection terminals disposed in conduction region 100, control region 200, or both.

The semiconductor layer having the device function means a semiconductor structure enabling the basic performance of various elements and functional circuits comprised in field-effect transistor 11, resistor 12, or control circuit 20. An electrode or a wiring merely intended to pass current may be provided in the semiconductor layer. Such a design allows especially control circuit 20 in control region 200 to prevent a function of causing a discharge current to be constant from being damaged due to a malfunction in the elements or functional circuits immediately below the plurality of external connection terminals at the time of mounting. In other words, it is possible to provide highly-reliable semiconductor device 1.

However, when a device structure is not deliberately provided immediately below the plurality of external connection terminals, there is a possibility that, for example, the installation area of field-effect transistor 11 is reduced in conduction region 100, and it is not possible to sufficiently ensure a conduction cross-section area required for conducting large current. In this case, some of the plurality of external connection terminals need not be provided. For example, as shown in FIG. 5B, in order to increase the installation area of field-effect transistor 11, one or more external connection terminals may be removed from the plurality of external connection terminals that are circular in shape and arranged in lattice positions. In FIG. 5B, four external connection terminals are not provided in the central portion of semiconductor device 1 in a plan view. Field-effect transistor 11 can be provided in the portion instead of the external connection terminals, which is convenient to conduct a large current. Nonetheless, the heat dissipation effect is reduced due to the loss of a heat dissipation path in the neighborhood, and a peak temperature becomes relatively higher than a temperature of a surrounding portion. However, for example, causing the portion excluding the external connection terminals to be a portion close to control region 200 produces an effect of offsetting to a certain extent the reduction in heat dissipation due to the lack of the external connection terminals and the effect of dissipating heat to control region 200 that originally generates no heat.

Stated differently, the above statement indicates that it is possible to intentionally shift a high-temperature peak position in the plane of semiconductor device 1. In FIG. 5B, control region 200 is provided close to the one end of the longer side of semiconductor device 1 (other shorter side 94 in FIG. 5B), and the portion in which no external connection terminals are disposed (hereinafter referred to as a central portion since the portion is located in the center of semiconductor device 1) is provided, in conduction region 100, on a side close to control region 200. The reason why the portion in which no external connection terminals are disposed is provided in conduction region 100 is because that way even if the discharge current flowing through conduction region 100 has a large current, it can be handled. Although the heat dissipation of the central portion is diminished due to the lack of the plurality of external connection terminals, the central portion is a position in which control region 200 can be effectively used as a heat dissipation path due to its proximity to control region 200. Accordingly, after dispersing the generated heat by the entirety of semiconductor device 1 is ensured to some extent, it is possible to shift a peak temperature position in switch region 30 in the central portion of semiconductor device 1 in a direction somewhat away from control region 200.

Although no external connection terminals are provided in the central portion in FIG. 5B, external connection terminals are axisymmetrically arranged with respect to, as a symmetrical axis, the center line bisecting the second direction. The axisymmetric arrangement has an advantage in preventing influences such as the bonding pressure at the time of mounting, a warp caused by the influence of heat, etc., from putting a biased load on semiconductor device 1. Additionally, the axisymmetric arrangement has another advantage in balancing dispersal heat dissipation by using the external connection terminals as a heat dissipation path because the heat is easily transferred to control region 200 close to the central portion but at the same time there is not the same means on one shorter side 93 of semiconductor device 1. It is safe to say that such an arrangement of the external connection terminals makes it easy to shift a peak temperature position in switch region 30.

In the example shown in FIG. 5B, the same holds true for resistor region 40. In other words, since a portion of resistor region 40 close to control region 200 has favorable heat dissipation, R terminal 16 may be provided on one shorter side 93 of semiconductor device 1 to achieve a balance. It is possible to shift a peak temperature position in resistor region 40 in a direction away from control region 200. It is possible to provide a sensor that senses a temperature, such as a sensor having an over temperature protection function, close to the shifted peak temperature position. If a position at which a peak temperature rises most considerably in the plane of semiconductor device 1 is detected, it provides assurance of safer operation at the time of use.

Accordingly, in the present embodiment, it is desirable that the plurality of external connection terminals of semiconductor device 1 be axisymmetrically arranged with respect to, as an axis, the center line bisecting semiconductor device 1 in the second direction in a plan view, and that a sensor that senses a temperature of semiconductor device 1 be disposed between switch region 30 and resistor region 40 and farther from control region 200 than the center line is in conduction region 100.

Moreover, in order to enhance the heat dissipation of resistor 12, in a plan view, resistor region 40 of semiconductor device 1 may include a wiring that directly or indirectly covers the entire surface of resistor 12, and the wiring may include a portion in contact with resistor 12 and be connected to one or more external connection terminals exposed to the surface of semiconductor device 1. Source wiring 119 may be used as the wiring, and R terminal 16 may be used as the external connection terminals.

Since heat generated by a discharge current flow is dissipated through a plurality of external connection terminals as a heat dissipation path, a larger Installation area of the plurality of external connection terminals results in better heat dissipation. On the other hand, semiconductor device 1 is very small in shape in a plan view and has a limit to an area to be used. For this reason, devoting an excessively larger installation area to the plurality of external connection terminals does not make it possible to ensure an area necessary for field-effect transistor 11 or others. Accordingly, as stated above, it is desirable that, in resistor 12 that generates an especially large amount of heat, an electrode or a wiring configured of a metal having favorable heat dissipation be provided to cover a top portion of resistor 12. Although the covering wiring has favorable heat dissipation when directly in contact with resistor 12, the covering wiring can be expected to contribute to some extent to the enhancement of heat dissipation even if the covering wiring indirectly covers resistor 12 in the form of an insulating film etc. being placed therebetween.

Embodiment 1 has been described thus far based on the assumption that the channel of field-effect transistor 11 is of n type. For this reason, it was supposed that the drain electrode and source electrode of field-effect transistor 11 are connected to the D terminal 13 side and the S terminal 14 side, respectively. The present embodiment is viable even if the channel of field-effect transistor 11 is of p type. In this case, the source electrode and drain electrode of field-effect transistor 11 are connected to the D terminal 13 side and the S terminal 14 side, respectively.

Embodiment 2

Figure 8:
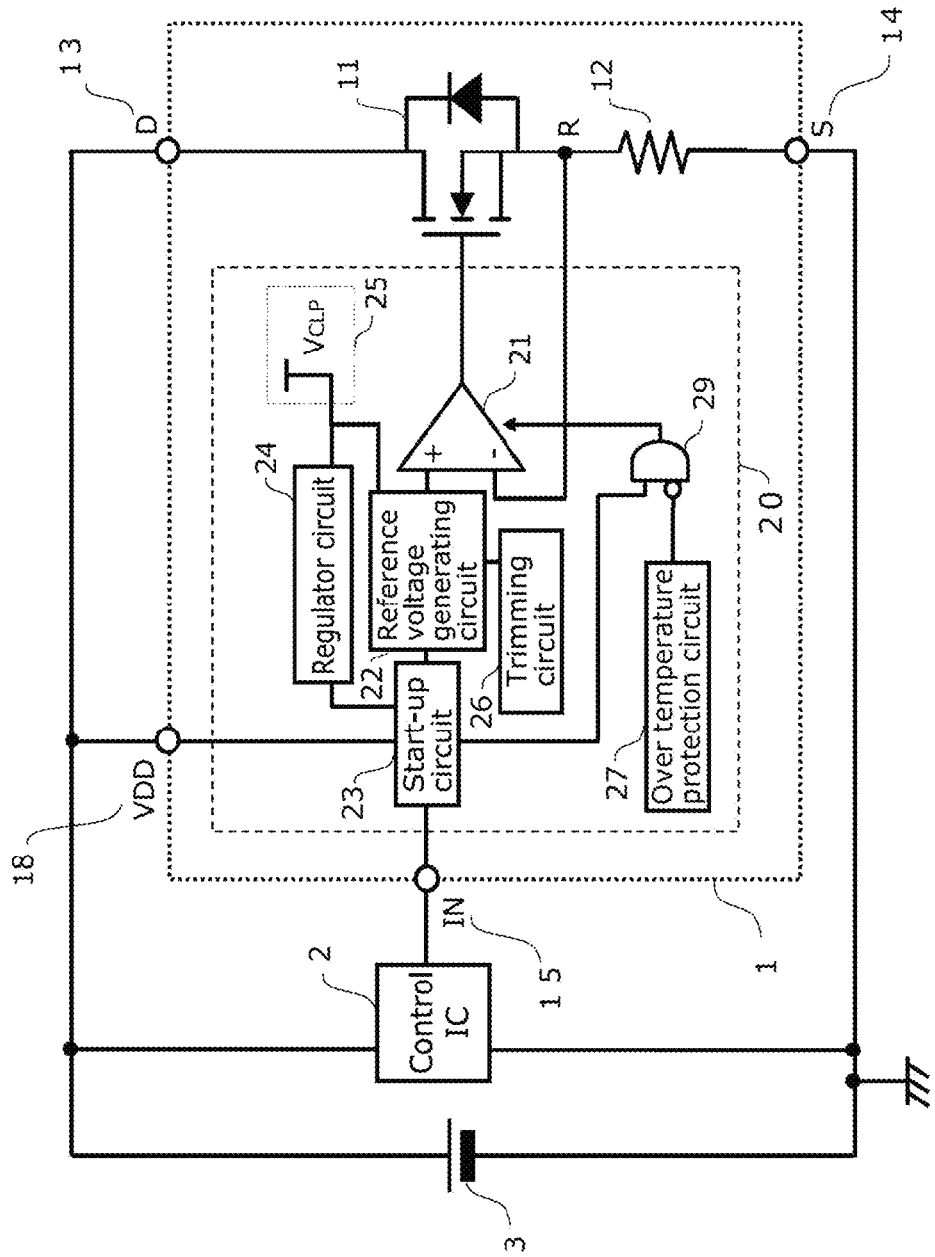
FIG. 8 is a circuit diagram illustrating a semiconductor device according to Embodiment 2.

FIG. 8 is a circuit diagram according to Embodiment 2. In Embodiment 2, not only operational amplifier 21 and reference voltage generating circuit 22 but also functional circuits are added to the constituent elements of control circuit 20 in semiconductor device 1.

Semiconductor device 1 according to Embodiment 2 further includes external power supply input terminal (VDD terminal) 18 exposed to the surface of semiconductor device 1. VDD terminal 18 is connected to the cathode of battery 3 and is an external connection terminal through which power for driving mainly control circuit 20 is supplied. Although D terminal 13 is also used as an external power supply input terminal in Embodiment 1, D terminal 13 may be used as an inflow terminal into which a discharge current flows, and separated VDD terminal 18 may be used as an external power input terminal. In other words, semiconductor device 1 may include external connection terminals exposed to the surface of semiconductor device 1, and the power input to control circuit 20 by electrically connecting control circuit 20 to an external connection terminal, among the plurality of external connection terminals, to which a voltage equivalent to a voltage applied to the inflow terminal into which the discharge current flows is applied.

VDD terminal 18 is connected to start-up circuit 23 in control circuit 20. The function of start-up circuit 23 will be described as required. Start-up circuit 23 has three branches. The first branch generates internal voltage 25 via regulator circuit 24. Internal voltage 25 is connected to input terminal 221 of reference voltage generating circuit 22 and serves as a source for outputting a reference voltage. Moreover, though not shown in FIG. 8, internal voltage 25 serves to supply power for driving operational amplifier 21 and the other functional circuits. It is more desirable to use internal voltage 25 than to directly connect VDD terminal 18 as a power supply. This is because there is a possibility that an abnormal voltage greatly exceeding a voltage of battery 3 is applied to VDD terminal 18 at the time of a failure, and control circuit 20 is likely to be broken at this time. Start-up circuit 23 and regulator circuit 24 are provided to prevent such a situation. To put it another way, the first branch from start-up circuit 23 is a protection system for control circuit 20.

Start-up circuit 23 has breakdown voltage characteristics that enable start-up circuit 23 to remain unbroken even if a voltage of abnormal value out of the range of normal operation is applied to start-up circuit 23. Regulator circuit 24 has a function of outputting preset voltage VCLP (V) when the voltage inputted from VDD terminal 18 exceeds preset value VCLP (V). Accordingly, internal voltage 25 reaches VCLP (V) at a maximum and supplies a voltage that does not break reference voltage generating circuit 22, operational amplifier 21, and the other functional circuits.

The second branch from start-up circuit 23 is connected to pulse signal input terminal 223 of reference voltage generating circuit 22. This configuration is for transmitting an external pulse signal inputted from control terminal (IN terminal) 15 connected to start-up circuit 23. Output terminal 222 of reference voltage generating circuit 22 is connected to non-inverting input terminal 211 of operational amplifier 21. Since the rest is the same as described in Embodiment 1, the description is omitted. The present embodiment differs from Embodiment 1 in that reference voltage generating circuit 22 includes a mechanism for receiving a signal from trimming circuit 26.

As described in Embodiment 1, in order to cause the discharge current flowing from D terminal 13 to S terminal 14 to have a predetermined constant value, operational amplifier 21 receives a voltage at first contact point 17 at inverting input terminal 212. Although the voltage at first contact point 17 is determined by resistance value Rr ($\Omega$) of resistor 12, manufacturing variations inevitably occur in the resistance value. Even if the resistance value of resistor 12 is shifted to Rr+$\Delta$Rr ($\Omega$), changing the reference voltage outputted by reference voltage generating circuit 22 to Va+$\Delta$Va=Ia×Rr+Ia×$\Delta$Rr (V) accordingly makes it possible to conduct the discharge current caused to have the predetermined constant value as before. Trimming circuit 26 has a function of changing the reference voltage outputted by reference voltage generating circuit 22 from Va to Va+ΔVa.

The third branch from start-up circuit 23 is connected to AND circuit 29. Over temperature protection circuit 27 inputs an inversion signal to AND circuit 29, and AND circuit 29 transmits to operational amplifier 21 a signal for permitting the driving of operational amplifier 21. Accordingly, the third branch is a command system for permitting the driving of operational amplifier 21 only when the pulse signal from start-up circuit 23 and the inversion signal from over temperature protection circuit 27 are inputted at the same time.

Over temperature protection circuit 27 is provided to prevent the peak temperature of semiconductor device 1 from exceeding an acceptable value. Although semiconductor device 1 generates heat due to the conduction of a discharge current, when the peak temperature increased due to the conduction exceeds a predetermined acceptable value, over temperature protection circuit 27 outputs a signal to AND circuit 29. Since the inversion signal from over temperature protection circuit 27 is inputted to AND circuit 29, when the peak temperature of semiconductor device 1 is less than the acceptable value, a signal for permitting the driving of operational amplifier 21 is transmitted; and conversely when the peak temperature of semiconductor device 1 is greater than or equal to the acceptable value, the signal for permitting the driving of operational amplifier 21 is stopped. When the driving of operational amplifier 21 is not permitted, an output for opening the gate of field-effect transistor 11 is not performed, and the discharge current stops.

It is desirable that a sensor portion that senses a temperature of over temperature protection circuit 27 be provided in a position where a peak temperature is easily sensed in semiconductor device 1 to sense a peak temperature. Although semiconductor device 1 is designed to disperse a power loss as much as possible in the present embodiment, since it is possible to shift a position at which a temperature increases, to a certain extent, as stated above, it is desirable that a sensor portion that senses a temperature be provided in such a position. In one example, in a plan view of semiconductor device 1, the sensor portion may be disposed in conduction region 100, between switch region 30 and resistor region 40 and farther from control region 200 than the center line bisecting the longer sides of semiconductor device 1 is.

Embodiment 3

Figure 9:
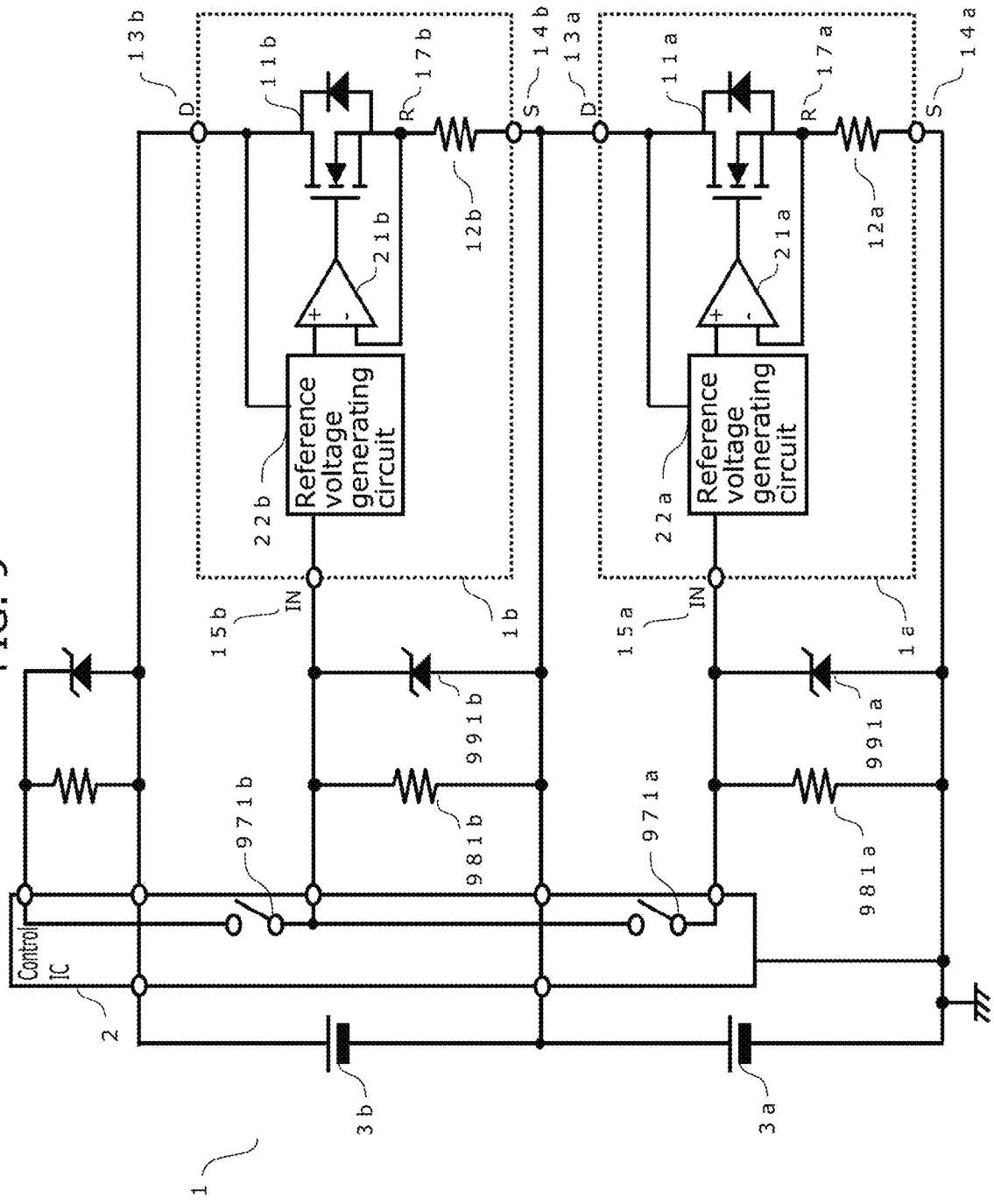
FIG. 9 is a circuit diagram illustrating a semiconductor device according to Embodiment 3.

Hereinafter, a circuit configuration including a semiconductor device according to the present embodiment will be described using FIG. 9 as Embodiment 3. FIG. 9 shows a configuration example of a cell balancing circuit in which the semiconductor device according to the present embodiment is applied to multiple cells (batteries connected in series, here two batteries). Cell balancing means a mechanism for achieving, when one battery among batteries is excessively charged, a balance between the one battery and the other batteries by discharging only the one battery separately. The semiconductor device according to the present embodiment is used when an excessively charged battery is discharged.

In FIG. 9, in a circuit that charges batteries 3a and 3b connected in series, semiconductor devices 1a and 1b are connected to batteries 3a and 3b in parallel, respectively. D terminals 13a and 13b of respective semiconductor devices 1a and 1b are connected to the cathode side of batteries 3a and 3b, and S terminals 14a and 14b of respective semiconductor devices 1a and 1b are connected to the anode side of batteries 3a and 3b. The output of control IC 2 is connected to each of IN terminals 15a and 15b. Moreover, drive resistor 981a and driving diode 991a are provided between IN terminal 15a and S terminal 14a outside of semiconductor device 1a, and drive resistor 981b and driving diode 991b are provided between IN terminal 15b and S terminal 14b outside of semiconductor device 1b.

Control IC 2 monitors a voltage of each of batteries 3a and 3b. For example, when even only one of the batteries exceeds a predetermined voltage, control IC 2 serves to cause all the batteries to stop charging. Moreover, control IC 2 serves to cause only a battery that has been charged beyond the predetermined voltage to start discharging. Since only a battery (e.g., battery 3a) that has exceeded the predetermined voltage is caused to start discharging, a voltage is applied to only IN terminal 15a of semiconductor device 1a connected to battery 3a, and field-effect transistor 11a is turned ON.

In the cell balancing circuit having the configuration shown in FIG. 9, when battery 3a is charged beyond a predetermined voltage (e.g., 5 V), control IC 2 stops the charging and turns on switch 971a in control IC 2. At this time, a path is formed from the cathode of excessively charged battery 3a to the anode of battery 3a via driving diode 991b and drive resistor 981a of semiconductor device 1a connected in parallel to battery 3a. Accordingly, since approximately 4.3 V obtained by dropping a potential (approximately 5 V) of the cathode of excessively charged battery 3a by a forward voltage (approximately 0.7 V) of driving diode 991b is inputted between IN terminal 15a and S terminal 14a outside of semiconductor device 1a, it is possible to turn on field-effect transistor 11a and to discharge battery 3a until the voltage of battery 3a reaches, for example, 4.5 V. Discharging battery 3a to 4.5 V turns off switch 971a in control IC 2, so field-effect transistor 11a is turned off, and the discharging from battery 3a is stopped. Then, the charging is started again immediately. This operation is repeated until all batteries 3a and 3b are charged to 5 V. Accordingly, it is possible to charge all batteries 3a and 3b to 5 V while preventing battery 3a from being excessively charged.

As with Embodiment 1, semiconductor device 1 according to Embodiment 3 makes it possible to prevent a peak temperature from locally concentrating in only resistor 12 in a discharge period, by intentionally causing a power loss in field-effect transistor 11. Alternatively, semiconductor device 1 may improve discharge efficiency by increasing a discharge current. At this time, it is possible to produce an effect of reducing the time required to complete the charging of all the batteries, by shortening the discharge period. Using the present embodiment as above makes it possible to improve a trade-off between the improvement of the discharge efficiency (reduction of time) and the reduction of temperature rise in the cell balancing use.

Embodiment 4

Figure 10:
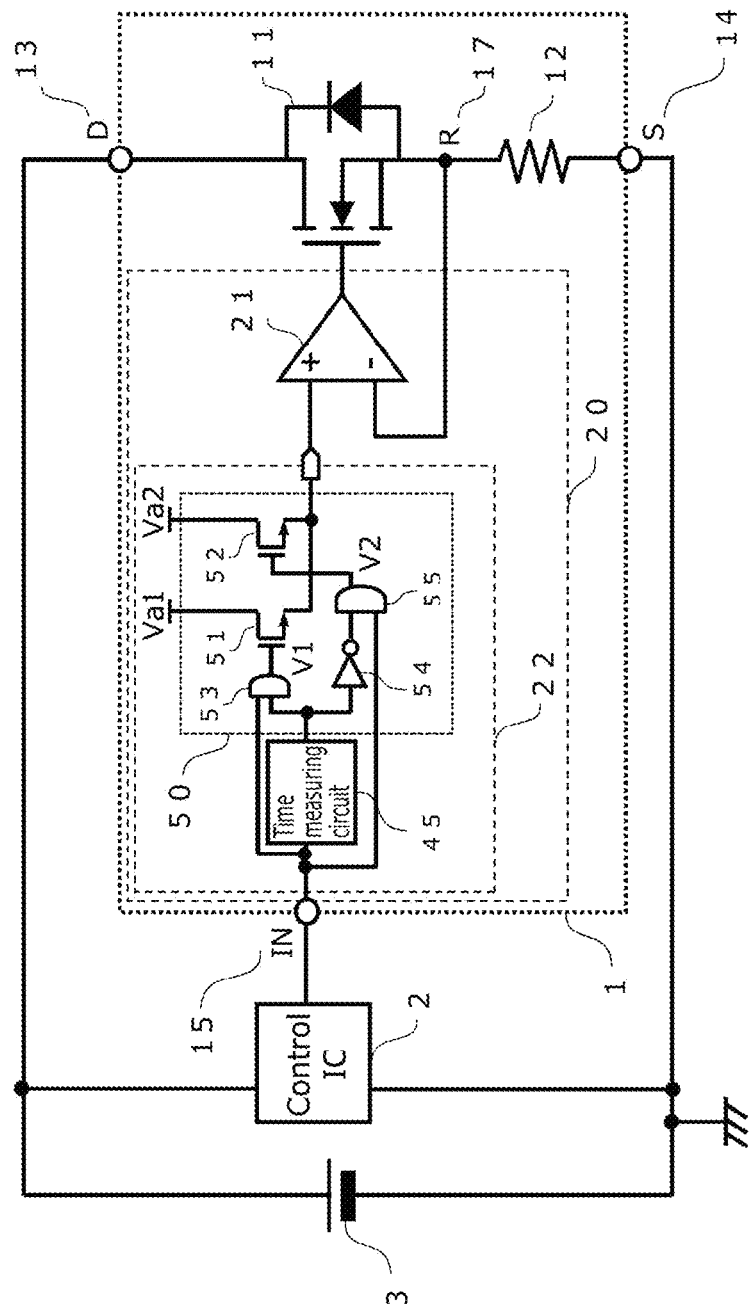
FIG. 10 is a circuit diagram illustrating a semiconductor device according to Embodiment 4.

FIG. 10 shows a circuit configuration including semiconductor device 1 according to Embodiment 4. In Embodiment 4, control circuit 20 of semiconductor device 1 includes, within reference voltage generating circuit 22, time measuring circuit 45 that measures time from when a pulse signal is inputted to control terminal (IN terminal) 15, and voltage selection circuit 50 to which first voltage level Va1 (V) and second voltage level Va2 (V) are preset.

Figure 11A:
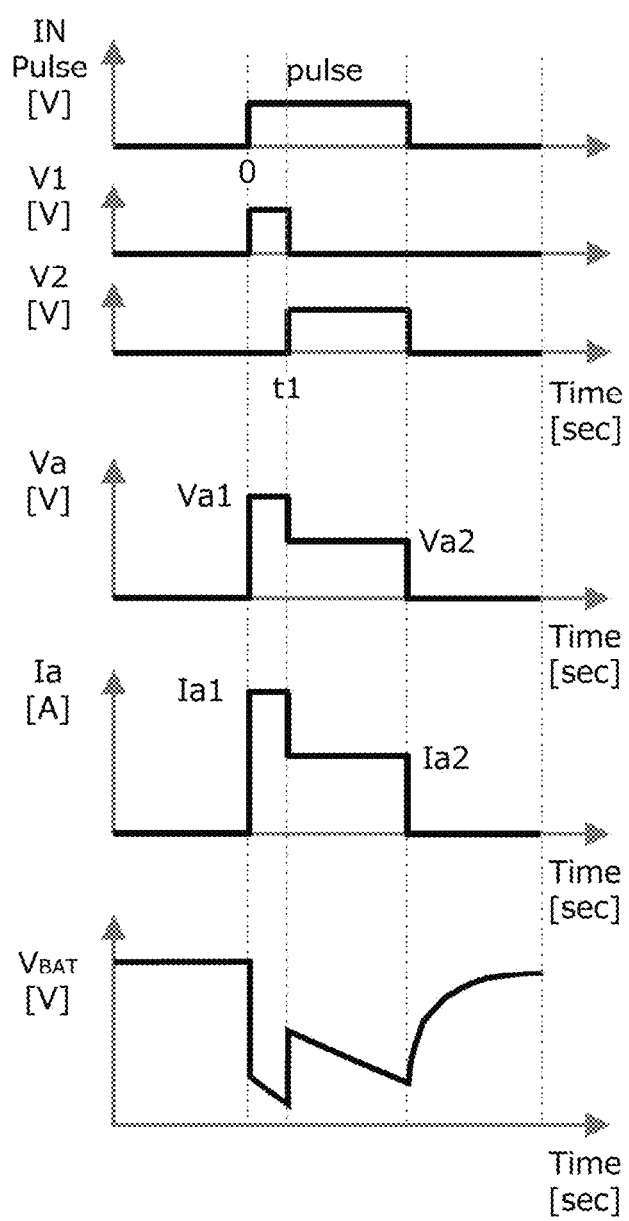
FIG. 11A is a schematic diagram illustrating examples of a signal waveform inputted to and outputted from the semiconductor device according to Embodiment 4.
Figure 11B:
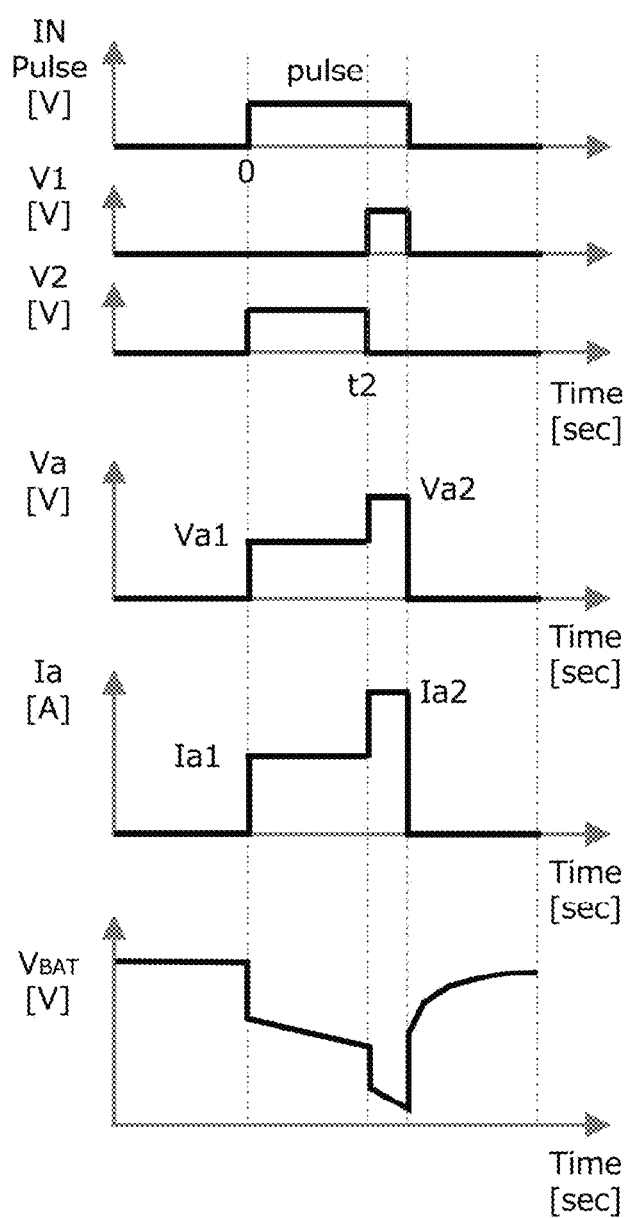
FIG. 11B is a schematic diagram illustrating examples of a signal waveform inputted to and outputted from the semiconductor device according to Embodiment 4.

As shown in FIG. 11A and FIG. 11B, instead of uniformly conducting a current having a certain value, but discretely changing the value of a discharge current before and after a certain time may be convenient. For example, in FIG. 11A, by conducting a discharge current at current value Ia1 (A) that is high only immediately after the discharging from battery 3, and increasing a voltage drop of battery 3 at this time, it is possible to improve the accuracy of measuring an internal impedance. It is possible to perform current conduction (Ia2 (A), Ia1>Ia2) in which a current value is reduced in order to prevent a power loss from increasing unnecessarily, for the remaining time. Moreover, when an internal impedance is measured from a voltage immediately before a discharge current is OFF, as shown in FIG. 11B, the voltage immediately before the discharge current is OFF may be adjusted to satisfy Ia1<Ia2. In a similar manner, it is possible to produce an effect of improving the accuracy of measuring the internal impedance of battery 3, and an effect of reducing an unnecessary increase in power loss.

The circuit shown in FIG. 10 is capable of performing such an operation using time measuring circuit 45 and voltage selection circuit 50. As shown in FIG. 11A or FIG. 11B, a time for changing a current value is preset to time measuring circuit 45. Suppose this time is t1 (sec), time measuring circuit 45 has a function of outputting a signal in a period from 0 (sec) when a pulse signal is inputted to IN terminal 15 to t1 (sec). At this time, since the pulse signal and the signal outputted from time measuring circuit 45 are inputted to AND circuit 53, the gate of transistor 51 is opened, and reference voltage generating circuit 22 outputs reference voltage Va1 (V) to operational amplifier 21.

After t1 (sec) since the pulse signal was inputted to IN terminal 15, time measuring circuit 45 outputs no signals. For this reason, AND circuit 53 outputs no signals, and the gate of transistor 51 is closed. On the other hand, since inverter 54 transmits an inversion signal of time measuring circuit 45, a pulse signal and the signal (the inversion signal of time measuring circuit 54) that is transmitted from inverter 54 are inputted to AND circuit 55. As a result, the gate of transistor 52 is opened, and reference voltage generating circuit 22 outputs reference voltage Va2 (V) to operational amplifier 21.

As stated above, a discharge period in which a pulse signal is inputted may include a first period that is a predetermined period from a start of the discharge, and a second period from the end of the first period to the end of the discharge period. A discharge current value in the first period may be different from a discharge current value in the second period. Moreover, reference voltage generating circuit 22 may include: time measuring circuit 45 that measures a time from when a pulse signal is inputted to control terminal 15; and voltage selection circuit 50 to which a first voltage level and a second voltage level are set. Voltage selection circuit 50 may be set to output by selecting the first voltage level until time measuring circuit 45 detects the predetermined time, and select the second voltage level after time measuring circuit 45 detects the predetermined time.

Although the semiconductor devices according to the present disclosure have been described above based on Embodiments 1 to 4, the present disclosure is not limited to these embodiments. Forms obtained by various modifications to each of the aforementioned embodiments that can be conceived by a person skilled in the art as well as other forms realized by combining some of the constituent elements in each of the aforementioned embodiments are included in the scope of the present disclosure as long as they do not depart from the essence of the present disclosure.

INDUSTRIAL APPLICABILITY

The present disclosure is widely applicable to a semiconductor device that measures an internal impedance of a secondary battery such as a lithium-ion battery with a high accuracy.

REFERENCE SIGNS LIST 1, 1a, 1b semiconductor device
2 control IC
3, 3a, 3b battery
11, 11a, 11b field-effect transistor
12, 12a, 12b resistor
13, 13a, 13b D terminal (inflow terminal)
14, 14a, 14b S terminal (outflow terminal)
15, 15a, 15b IN terminal (control terminal)
16 R terminal (external resistor terminal)
17, 17a, 17b first contact point
20 control circuit
21, 21a, 21b operational amplifier
22, 22a, 22b reference voltage generating circuit
23 start-up circuit
24 regulator circuit
25 internal voltage
26 trimming circuit
27 over temperature protection circuit
29 AND circuit
30 switch region (field-effect transistor portion)
40 resistor region (resistor portion)
45 time measuring circuit
50 voltage selection circuit
51, 52 transistor
53, 55 AND circuit
54 inverter
90 boundary line between conduction region and control region
100 conduction region
111 semiconductor substrate
112 drift layer
113 well layer
114 source region
115 drain region
116 gate insulating film
117 gate electrode
118 drain wiring
119 source wiring
200 control region
211 non-inverting input terminal of operational amplifier
212 inverting input terminal of operational amplifier
213 output terminal of operational amplifier
221 input terminal of reference voltage generating circuit
222 output terminal of reference voltage generating circuit
223 pulse signal input terminal of reference voltage generating circuit
971a, 971b switch
981a, 981b drive resistor
991a, 991b driving diode

The invention claimed is:

1. A semiconductor device that is of a face-down mounted chip-size package type, discharges electric charges stored in an electric storage device, and has a power loss area ratio of at least 0.4 (W/mm$^2$) obtained by dividing a power loss (W) in the semiconductor device at time of the discharge by an area (mm$^2$) of the semiconductor device, the semiconductor device comprising:

an inflow terminal and an outflow terminal into and out of which a discharge current flows, respectively, at the time of the discharge;

a control terminal that controls a discharge period for the discharge;

a field-effect transistor of a lateral type and a resistor that are connected in series in stated order between the inflow terminal and the outflow terminal; and a control circuit connected to the control terminal, the control circuit causing the discharge current to be constant without depending on an applied voltage between the inflow terminal and the outflow terminal, wherein a difference between a maximum temperature of a field-effect transistor portion and a temperature of a resistor portion is within five degrees Celsius in the discharge period, the field-effect transistor portion being a region in which the field-effect transistor is disposed, the resistor portion being a region in which the resistor is disposed.

2. The semiconductor device according to claim 1, wherein the maximum temperature of the field-effect transistor portion is higher than the temperature of the resistor portion in the discharge period.

3. The semiconductor device according to claim 1, wherein when a minimum voltage Vmin (V) in operating specification is applied to the semiconductor device, the field-effect transistor has a conduction resistance value Ron ($\Omega$) greater than a resistance value Rr ($\Omega$) of the resistor.

4. The semiconductor device according to claim 3, wherein when the minimum voltage Vmin (V) in operating specification is applied to the semiconductor device, the field-effect transistor has the conduction resistance value Ron ($\Omega$) at least four times and less than ten times the resistance value Rr ($\Omega$) of the resistor.

5. The semiconductor device according to claim 1, wherein the control circuit is supplied with power from the inflow terminal.

6. The semiconductor device according to claim 1, wherein the discharge period includes a first period that is a predetermined period from a start of the discharge, and a second period from an end of the first period to an end of the discharge period, and a discharge current value in the first period is different from a discharge current value in the second period.

7. A semiconductor device that is of a face-down mounted chip-size package type, discharges electric charges stored in an electric storage device, and has a power loss area ratio of at least 0.4 (W/mm$^2$) obtained by dividing a power loss (W) in the semiconductor device at time of the discharge by an area (mm$^2$) of the semiconductor device, the semiconductor device comprising:

a plurality of inflow terminals and a plurality of outflow terminals into and out of which a discharge current flows, respectively, at the time of the discharge;

a control terminal that controls a discharge period for the discharge;

a field-effect transistor of a horizontal type and a resistor that are connected in series in stated order between the plurality of inflow terminals and the plurality of outflow terminals; and a control circuit connected to the control terminal, the control circuit causing the discharge current to be constant without depending on an applied voltage between the plurality of inflow terminals and the plurality of outflow terminals, wherein the semiconductor device is rectangular in shape in a plan view of the semiconductor device, a part or all of the plurality of inflow terminals are arranged along one longer side of the semiconductor device, a part or all of the plurality of outflow terminals are arranged along an other longer side of the semiconductor device, the semiconductor device includes a conduction region that includes the field-effect transistor and the resistor and through which the discharge current flows, and a control region that includes the control circuit and through which the discharge current does not flow, the conduction region and the control region are divided by a virtual boundary line parallel to one shorter side of the semiconductor device, and the control region has an area at least one-sixth and less than one-half the area of the semiconductor device.

8. The semiconductor device according to claim 7, wherein in the plan view, the conduction region is disposed in a central part in a longer-side direction, and the control region is disposed at both ends in the longer-side direction.

9. The semiconductor device according to claim 7, wherein in the plan view, the conduction region is disposed at one end in a longer-side direction, and the control region is disposed at another end in the longer-side direction.

10. The semiconductor device according to claim 7, wherein in the plan view, the control region is disposed in a central part in a longer-side direction, and the conduction region is disposed at both ends in the longer-side direction.

11. The semiconductor device according to claim 7, comprising:

a plurality of external connection terminals exposed to a surface of the semiconductor device, wherein the plurality of external connection terminals include the plurality of inflow terminals and the plurality of outflow terminals, and in the plan view, in a shorter-side direction, the field-effect transistor is disposed on a plurality of inflow terminals side, and the resistor is disposed on a plurality of outflow terminals side.

12. The semiconductor device according to claim 11, wherein in the plan view, none of the plurality of external connection terminals is disposed between the part of the plurality of inflow terminals and the one longer side of the semiconductor device, in the plan view, none of the plurality of external connection terminals is disposed between the part of the plurality of outflow terminals and the other longer side of the semiconductor device, and the part of the plurality of inflow terminals and the part of the plurality of outflow terminals are paired in a stripe-shaped region along the shorter-side direction.

13. The semiconductor device according to claim 12, wherein in the plan view, the plurality of external connection terminals are circular or rounded rectangular in shape, and the plurality of external connection terminals are not disposed in a position that is different from, among lattice positions evenly spaced and arranged in parallel with the shorter-side direction and a longer-side direction, first-row positions or second-row positions equidistant from the one longer side and the other longer side of the semiconductor device and aligned in the longer-side direction, and first-column positions or second-column positions equidistant from the one shorter side and an other shorter side of the semiconductor device and aligned in the shorter-side direction.

14. The semiconductor device according to claim 11, wherein the field-effect transistor includes a plurality of fingers parallel to a longer-side direction in the plan view, a plurality of unit cells of the field-effect transistor are rectangular in shape and each have a longer side parallel to the longer-side direction, a drain wiring and a source wiring each include portions alternately arranged in the longer-side direction and forming a comb shape, the drain wiring connecting the plurality of inflow terminals and a drain electrode of the field-effect transistor, the source wiring connecting the resistor and a source electrode of the field-effect transistor, and a sum of unit widths of the portions of each of the drain wiring and the source wiring in the longer-side direction is substantially equal to a length of the longer side of each of the plurality of unit cells of the field-effect transistor.

15. The semiconductor device according to claim 7, wherein the resistor has a conduction width for the discharge current that matches a length of the conduction region in a longer-side direction, and one or more resistors identically shaped are connected in parallel, the one or more resistors each having a conduction length of at most 15 μm for the discharge current.

16. The semiconductor device according to claim 7, wherein a ratio of an area of a resistor portion to an area of a field-effect transistor portion is substantially equal to a ratio of a resistance value Rr (Ω) of the resistor to a conduction resistance value Ron (Ω) of the field-effect transistor when a minimum voltage Vmin (V) in operating specification is applied to the semiconductor device, the field-effect transistor portion being a region in which the field-effect transistor is disposed, the resistor portion being a region in which the resistor is disposed.

17. The semiconductor device according to claim 11, wherein the semiconductor device does not include a semiconductor layer having a device function immediately below the plurality of external connection terminals disposed in at least one of the conduction region or the control region.

18. The semiconductor device according to claim 11, wherein the resistor portion includes a wiring disposed and directly or Indirectly covering part of the resistor in the plan view, and the wiring includes a portion in contact with the resistor, is exposed to the surface of the semiconductor device, and is connected to at least one of the plurality of external connection terminals.

19. The semiconductor device according to claim 11, wherein the plurality of external connection terminals are arranged in a line-symmetrical manner with a center line bisecting the semiconductor device in a longer-side direction, and a sensor is disposed between a field-effect transistor portion and a resistor portion and farther from the control region than the center line is in the conduction region, the sensor sensing a temperature of the semiconductor device, the field-effect transistor portion being a region in which the field-effect transistor is disposed, the resistor portion being a region in which the resistor is disposed.

* * * * *